(12) United States Patent
Eidson et al.

(10) Patent No.: US 7,783,958 B1
(45) Date of Patent: Aug. 24, 2010

(54) BROADBAND SATELLITE SYSTEM FOR THE SIMULTANEOUS RECEPTION OF MULTIPLE CHANNELS USING SHARED ITERATIVE DECODER

(75) Inventors: Donald Brian Eidson, San Diego, CA (US); Arndt Joseph Mueller, San Diego, CA (US); Joseph B. Soriaga, San Diego, CA (US); Itzhak Gurantz, San Diego, CA (US)

(73) Assignee: Entropic Communications, Inc., San Diego, CA (US)

( * ) Notice: Subject to any disclaimer, the term of this patent is extended or adjusted under 35 U.S.C. 154(b) by 966 days.

(21) Appl. No.: 11/555,685

(22) Filed: Nov. 1, 2006

Related U.S. Application Data

(60) Provisional application No. 60/733,216, filed on Nov. 3, 2005.

(51) Int. Cl.
*H03F 13/00* (2006.01)
(52) U.S. Cl. .................. 714/780; 714/776; 455/452.1

(58) Field of Classification Search .................. 714/780, 714/776; 455/452.1
See application file for complete search history.

(56) References Cited

U.S. PATENT DOCUMENTS 6,182,264 B1 * 1/2001 Ott .............................. 714/774
7,437,166 B2 * 10/2008 Osseiran et al. .......... 455/452.1

* cited by examiner

*Primary Examiner*—Guy J Lamarre
(74) *Attorney, Agent, or Firm*—Bruce W. Greenhaus

(57) ABSTRACT

Multiple channels of received data are processed by a multiple channel demodulation and error correction decoding engine. The statistical uncertainty of processing channels with an iterative decoder are averaged across all the channels to reduce the total processing power required of the decoding engine compared to processing each channel with a separate engine. A set of input buffers holds blocks of data for each channel needing decoding. A quality measure is computed on each input block to set the priority and iteration allocation of decoding in the common decoder. The input RF signal is digitized by a broadband tuner that processes some or all of the channels to feed the multiple channel demodulator and decoder. Multiple decoded video data streams are output.

15 Claims, 21 Drawing Sheets

BROADBAND SATELLITE SYSTEM FOR THE SIMULTANEOUS RECEPTION OF MULTIPLE CHANNELS USING SHARED ITERATIVE DECODER

RELATED APPLICATIONS

This application claims priority from U.S. provisional application No. 60/733,216 filed Nov. 3, 2005 entitled "Broadband Satellite System for the Simultaneous Reception of Multiple Channels", incorporated herein by reference.

BACKGROUND

1. Field of Invention

The invention relates to satellite communications and demodulation and decoding of digital data.

2. Prior Art

The worldwide utilization of satellite communications for the reception of digital TV signals has grown at a rapid pace in the last 10 years. The utilization of digital video technology for Direct Broadcast Satellite ("DBS") systems allowed many folds increase in the number of video programs that can be transmitted over a single satellite and significantly accelerated the utilization of satellites for video transmission directly to the consumer both in the US and internationally.

A typical DBS home installation includes one or more dish antennae that receive signals from one or more broadcasting satellites. Some dishes support multi-satellite feeds and can receive signals from more than one satellite (usually satellites in adjacent orbital locations or at different frequency bands). In this typical installation, multiple Low Noise Block Converters (LNBs) accept the high radio frequency (RF) satellite signal feed, down covert the signals to an intermediate frequency (IF) signal, drive a multi-port RF switch, and the switch outputs are connected through cables to the various Set-Top Boxes (STBs) inside the house.

FIG. 1 shows a typical configuration where all the available and relevant satellite signals are presented at the multi-port switch inputs. Each STB in turn, selects the specific satellite signal it needs to view a desired program by monitoring an internal look-up table guide that lists the specific satellite, polarization and transponder required for reception of the program. A single transponder may carry several video programs. A satellite transponder signal is also called a channel. A control signal is sent by the STB to the switch through the connected cable to select the desired switch input that contains the desired program. Once a selection is made, the switch will make the input available on the cable for demodulation and decoding by the STB.

A typical DBS satellite carries two polarizations with 16 transponders each. Since each of the satellite polarizations provides 500 MHz bandwidth, the total bandwidth of a DBS satellite is around 1 GHz. This 1 GHz of bandwidth is typically configured in two primary ways. In one configuration, there are one or two outputs from the LNB; in the case of one output, only one polarization is selected by the STB and is provided to the LNB output, while in the case of two LNB outputs each LNB output carries a single polarization with bandwidth of about 500 MHz. FIG. 2 shows transponder frequencies for the case where there are two LNB outputs. Typically, the signals from the two polarizations are offset in frequency such that the center frequency of the transponders in one polarization falls in between transponder frequencies of the other polarization.

FIG. 3 shows a second configuration, where the two polarizations are "stacked" together and are contained in the 950-2150 MHz band. Since a reasonably priced, long inter-facility link (IFL) cable may be able to carry less than 1.5 GHz of total bandwidth above 950 MHz, at most only two 500 MHz wide polarizations can be carried on the cable. The 500 MHz signals can be from the same or different satellites. The frequencies from 0 to 760 MHz or 850 MHz are commonly used for over the air broadcast frequencies or cable television.

The prior art architecture needs to be changed drastically once a single cable STB requires the simultaneous reception of more than two programs. Since the multiple programs may be sourced from different satellites and/or different polarizations, the total bandwidth required to receive all the programs can be as much as 500 MHz per each viewed program for the number of simultaneously received programs, which can easily exceed the tuning bandwidth available on a single IFL cable, and could be as high as the total bandwidth of all the satellites. This is particularly a problem with the anticipated wide deployment of Digital Video Recorders (DVRs). The ability to record multiple simultaneous programs is critically important for satellite operators since it can mitigate somewhat their inability to offer a true Video on Demand (VOD) services offered by competitors such as the cable operators. The ability to record multiple simultaneous programs enables the user to have an effective time shifting alternative to VOD. Thus, it is quite advantageous for the satellite operators to provide a STB with several channel receivers, thus enabling the user to watch a program while simultaneously recording several others. Also, one can consider an architecture where a "Media Center" STB with multiple receivers feeds can provide multimedia programming such as video and audio to multiple "Thin Client" STBs in other rooms using home networking technology for the transmission of the selected programming.

More recently, new satellite switches have been developed that can place a number of selected individual satellite transponder channels from all the connected satellites and polarizations into a single IFL cable, as disclosed in U.S. Pat. No. 7,130,576 issued Oct. 31, 2006 entitled "Signal selector and combiner for broadband content distribution", subject to common assignment as the present application and incorporated herein by reference.

FIG. 4 shows the new system where a single STB connected to the outdoor unit (ODU) by a single IFL cable can now receive programs from two or more separate satellites simultaneously. This enables an STB connected by a single cable to employ two or more tuners and have simultaneous access to multiple programs, independent of how many satellites are being received. This is very important since the STB may serve two TV sets simultaneously or it enables the user to watch one program and at the same time record a second program from any of the connected satellites.

In order to receive multiple simultaneous programs from multiple satellites in a STB with a single IFL cable, additional processing of the signals from the various LNBs is performed. Transponder signals are selected from the LNB outputs and combined into a composite signal to enable all the desired channels requested by the various STBs to be processed and provided on the single IFL cable. More than a single IFL cable can be utilized if necessary, whereas the necessary channels are delivered to the corresponding STBs connected to each cable.

There are several alternative options that can be considered but all deal with extracting portions of the traditional satellite full-polarization signal to be transmitted through the IFL cable. Following is a short discussion of the alternatives:

1. For each of the desired programs, extracting a portion of the signal from the LNB that includes the transponder carrying the program. Then constructing an equivalent IFL signal that includes all the newly extracted signals that carry all the desired programs. In this fashion, assuming that one does not need to perform any signal demodulation, the minimum signal section that is required to carry a given program is a single bandwidth section that carries the desired program, which is a transponder channel. Assuming an IFL capable of carrying the traditional 950-2150 MHz bandwidth, as many as 32 arbitrary programs from multiple satellites can be received simultaneously. The outdoor device performs the function of selecting sections of multiple satellite polarizations and reconstructing a new signal for transmission to the indoor unit is called generically a Frequency Translating Module (FTM). The FTM can be constructed in many configurations, but in the present document it denotes a device that selects several desired transponder channels and reconstructs these channels into a certain span of bandwidth (usually in the 950-2150 MHz band) for inputs to the STBs.

2. Other alternatives that can carry even more programs exist, but may require more elaborate signal processing performed outdoors. In this case, the digital video and audio signals of the desired program are extracted from the corresponding transponders and transmitted to the STBs for storage and/or viewing, or for alternate processing including storage in other devices. The aggregate signals that include all the digital video and audio signals of the selected program can be carried in several forms including various forms of modulation different than the original modulation (denoted transmodulation), or where the various digital video signals of the selected programs are re-multiplexed, and re-modulated in a fashion similar to the original signals and then can be received by the same STBs that receive the original signals, or can be delivered as digital signals over some networking technology and protocol such as Ethernet or others.

Once all the selected transponder channel signals have been re-arranged to fit in a single cable, it enables another highly beneficial option. Since all these transponders have been selected based on user requirements, it is assumed that all, or at least most of them are arranged in a contiguous fashion in the frequency domain. Hence, all the channels that need to be demodulated are available in a certain section of bandwidth that can be fit within the bandwidth carrying capability of a single cable. Hence, these channels can be demodulated simultaneously utilizing a new broadband demodulator front-end described below.

Traditional multi-channel DBS system reception requires the selection of the desired programs and the corresponding one or more transponder channels that carry these programs to be demodulated simultaneously. However, since the selected programs are arbitrary, the corresponding transponder channels can be at arbitrary frequencies, transmitted from arbitrary satellites (in a multiple satellite system) and at arbitrary polarization.

In the traditional method, a transponder channel is received from a selected satellite and a selected polarization, and a separate tuner/demodulator receives the transponder channel frequency and demodulates it. Hence, it requires a separate tuner and demodulator for each demodulated transponder channel and the duplication of the signal processing required for demodulating and decoding all the channels.

If, however, all the required transponder channels are available in a certain range of frequencies at a given polarization, as is the case discussed above where the system organizes all the transponder channels that require demodulation to be available on such a bandwidth section, then it is possible to utilize a single broadband tuner to select and down convert the corresponding section of bandwidth before the analog to digital (A/D) conversion process used by the digital demodulator(s). Also, the demodulator(s) can utilize a broadband front-end to digitize the entire section of bandwidth and perform the remaining demodulation and signal processing in the digital domain that could be more efficient compared to the multiple simultaneous demodulators. One approach is described in Zhang, et al, Digital implementation of multichannel demodulators, U.S. published application 20030056221, published Mar. 20, 2003.

FIG. 5 shows prior art, multiple demodulator architecture in existing satellite STBs. In this implementation, RF signals from one or more cables in the 950-2150 MHz range are provided as input to multiple tuners. Depending on system configuration, the RF input signals to the tuners can be the same to all tuners, different to each tuner or any other configuration where the RF input to some of the tuners is the same. Each of the tuners tunes to the transponder frequency that contains the desired video channel and provides I and Q baseband components to the demodulator/decoder for demodulating, decoding and data extraction that is provided to the transport stream decoding, conditional access decryption and MPEG decoding. This architecture is very flexible and can receive and decode any channel from any satellite, polarization and transponder assuming that the system can provide access to all satellites and polarizations (through the utilization of an appropriate outdoor switch).

FIG. 6 shows a block diagram of a prior art tuner, such as one of those shown in FIG. 5. In this block diagram, a single conversion tuner is shown. The RF input signal is amplified by a front-end low noise amplifier (LNA) with gain and gain control. The gain control is needed to compensate for the potential large dynamic range that can be encountered due to different IFL cable attenuations and LNB gain. The RF signal is split and then down-converted by a Quadrature down-converter. The down converted components, designated as I and Q, are each filtered by a baseband filter and then amplified by a baseband Automatic Gain Control (AGC) and provided to the demodulator/decoder. The whole process is generally controlled by a controller that selects the synthesizer frequency (mostly as a function of user channel selection), adjusts the RF AGC levels (if necessary, the AGC can be an independent function as well or in combination with the controller) and baseband filter bandwidth.

FIG. 7 shows the spectrum of the signals of FIG. 6. One of the transponder channels (Ch k) is selected for demodulation by the controller for viewing one or more of the digital video signals transmitted in this transponder channel. The synthesizer is tuned to the center frequency of Ch k and the quadrature down-converter down converts the Ch k signal to the two baseband components, Ch k-I and Ch k-Q centered at 0 Hz or other low frequency. The low pass I and Q filters filter the down-converted I and Q signals. The signals are amplified appropriately by fixed or variable gain amplifiers and passed to the demodulator/decoder for all the additional processing needed in order to extract the desired digital video channel.

The main functions performed after the down conversion and digitization of the I and Q signals are the demodulation of the transponder signal and performing the Forward Error Correction (FEC) decoding. Various techniques of demodulation and FEC decoding are well known and are widely discussed in numerous books and technical literature. For example, "Digital Communications" by John Proakis, published by McGraw Hill series in Electrical and Computer Engineering, discusses extensively various techniques for demodulating and decoding digital communication signals.

Error correction coding and decoding is needed for the transmission and reception of digital video signals. To conserve transmitter power and reduce the size of the receiving antenna dish, the links are being operated with low Signal to Noise Ratio (SNR) margins and non-zero raw bit error rates (BER). Digital video requires near error free data to avoid visible impairments to the viewed program. Corrected error rates of 1 bit in a billion (1e-9), or better, are typically needed to result in a satisfactory video image. Compression of the digital data increases the need for error free data. Well-known Forward Error Correction (FEC) techniques are used to assure error free communication in the noisy channel. Redundancy or check bits are added to the transmitted video data then used to correct errors in the data in the receiver. In satellite systems, such as the one specified by the Digital Video Broadcasting for Satellite (DVB-S1) standard, error-correcting block codes such as Reed-Solomon (RS) codes are used in conjunction with convolutional codes. In this concatenated coding approach, the RS code is the outer code and the convolutional code is the inner code. A two stage decoding process is done in the receiver.

More powerful FEC techniques such as turbo code or low density parity check (LDPC) code FEC can be applied to satellite communication transmission techniques to further improve BER at a given power level or reduce power requirements while maintaining the same BER as other FEC approaches. Turbo codes, coders, and decoders are described in U.S. Pat. No. 5,406,570, Berrou et al., Apr. 11, 1995, entitled "Method for a maximum likelihood decoding of a convolutional code with decision weighting, and corresponding decoder"; U.S. Pat. No. 5,563,897, Pyndiah et al., Oct. 8, 1996, entitled "Method for detecting information bits processed by concatenated block codes"; U.S. Pat. No. 6,304,996 Van Stralen et al. Oct. 16, 2001, entitled "High-speed turbo decoder", each incorporated herein by reference. LDPC codes, encoders, and decoders are described in R. G. Gallager, "Low-Density Parity-Check Codes", M.I.T. Press, 1963; U.S. Pat. No. 6,961,888, Jin et al, Nov. 1, 2005, entitled "Methods and apparatus for encoding LDPC codes"; U.S. Pat. No. 6,633,856 Richardson et al, Oct. 14, 2003, entitled "Methods and apparatus for decoding LDPC codes." Turbo and LDPC codes and decoders are well known.

Turbo and LDPC codes have a disadvantage of high decoding complexity. Turbo and LDPC decoders operate iteratively on the received data block to correct errors and the number of iterations required to decode the data is not known with certainty until the decoding process is complete. A system must have sufficient processing power to iteratively decode the data under worst-case expected conditions. The decoder power needed for the worst-case condition is higher than the average requirement.

A system may include a large buffer for a single stream of data of incoming data followed by a single iterative decoder. While the decoder is operating on a block taking longer than average, the buffer stores incoming data. This allows some averaging of processing demands on a single stream of data over time, at the expense of latency and large buffer capacity.

The prior art approaches to processing multiple channels of digital video data rely on separate error correction units for each channel. Each decoder needs processing power equal to the worst-case requirement. A need exists for efficient processing of several transponder channels in a set top box.

SUMMARY OF THE INVENTION

Demodulation and decoding of multiple channels that are present in a certain section of bandwidth are processed with a multi-channel demodulator. The multi-channel demodulated signal is decoded with an iterative decoder, the use of which is shared among all the channels being decoded. All channels are processed by a multiplexed resource and multiple channels are outputted. By sharing a common decoding resource, processing capacity can be allocated across all the channels to optimize the use of the decoding resource. A quality measure calculated on each channel influences the decoding process, wherein priority among channels is determined and some channels can be excluded. The quality measure also determines the reserve and maximum number of iterations allocated to a channel. The uncertainty associated with the processing requirements of individual channels is averaged to reduce the overall uncertainty of processing of the aggregate of all channels.

The present invention provides the aggregate demodulation and decoding of multiple channels that are present in a certain section of bandwidth. The section of bandwidth is digitized; the appropriate channels are extracted, demodulated and decoded. All channels are processed by a multiplexed resource. Such aggregate processing of multiple channels results in significant savings and benefits and consists of the following elements:

1. The utilization of a single broadband tuner front-end as compared to the multiple tuners required in the traditional approach.

2. The utilization of a single Analog Front End (AFE) that includes a single or dual, high-speed analog to digital converters (A/Ds) to digitize the broadband signal. It is also possible to use several A/Ds to digitize the broadband signal if the required bandwidth is wider than it is possible to achieve with a cost effective A/D technology. It is likely that such an AFE is more efficient compared to the case where each demodulator requires a separate AFE.

3. A single package that includes an AFE (or several AFEs) and multiple demodulators/decoders saves several packages and many I/O pins.

4. Efficient, simultaneous, multi-channel demodulation, which reduces complexity when compared to multiple, single channel demodulations.

5. The multiplexed (shared decoding resource) decoding of multiple channels, which can save a significant amount of complexity, especially when utilizing iterative decoding such as Turbo decoders or Low Density Parity Check (LDPC) decoders.

The shared decoding of multiple simultaneous data streams of iterative decoding schemes such as turbo decoding and/or LDPC decoding enables an efficient decoding due to the statistical nature of the decoding process: the amount of required decoding processing varies from channel to channel and varies over time for each channel, producing uncertainty and variability in the decoding iterations needed. A single decoder requires a processing engine that is sufficiently powerful to process the worst-case situation; that is, can perform a sufficiently large number of iterations to satisfy performance requirements. However, due to the statistical nature of the decoding process, the decoding of multiple streams at a given Signal to Noise Ratio (SNR) are largely independent and require independent number of iterations each to satisfy the required performance. A single decoder which is decoding all the streams can take advantage of this independence, which results in an average decoding load across all streams, and decode all the streams with a processing efficiency improvement of 30-50% compared to the complexity of multiple decoders of the same performance level.

The advantage of using an efficient decoding of multiple, simultaneous data streams is enhanced significantly when those data streams belong to channels with different signal to noise ratios, as is likely the case for typical satellite communications. The different channels typically can belong to different transponders that may originate at different satellites and different polarizations. Even in the most controlled environment, it is very unlikely that the signal to noise ratio (SNR) of the various channels (typically a channel is a transponder) is maintained to within 1-2 dB of each other. On the other hand, as will be shown in the following section, the number of iterations required to achieve a given Bit Error Rate (BER) is significantly impacted by the operating signal to noise ratio. The amount of processing required to decode a turbo code or an LDPC code data stream is impacted significantly as a function of operating SNR. At most SNR levels above an upper threshold, the required processing to achieve a nearly error free performance is very small. Then, within a very small SNR decrease, in the range of 0.5-0.8 dB, the amount of processing (as represented by the number of iterations consumed by an iterative decoder) to achieve very low bit error rate (BER) is increased sharply, to a level numerous times that consumed at a higher SNR. Then, when the channel SNR falls below a lower threshold, no amount of processing can recover the data, hence processing is wasted if continued. Thus, significant efficiency can be achieved by directing processing toward decoding the streams that can most effectively utilize processing resources at any given time. When the SNR of all the channels is significantly above the upper threshold, as is the case in clear skies, relatively little amount of processing is required to achieve the required BER performance. Once communication channel fading commences, it is very likely that only one or two channels at a time fall into the limited SNR band where additional processing can achieve the effective reduction of BER. As the fade increases, different channels may fall into this SNR band where processing is beneficial, while other channels may fall below the lower threshold, where no processing should be performed.

A multi-channel tuner/demodulator/decoder according to the present invention can significantly reduce the complexity and the cost of a multi-channel satellite and similar front-ends compared to the traditional implementation that duplicates the demodulation/decoding process for each channel. Significant efficiency can be gained from the aggregate, multiplexed decoding of multiple channels. Hybrid schemes are also possible where some but not all of the techniques and processing described above and below are performed to improve efficiency. These schemes are possible in cases where due to various limitations the full utilization of all the steps highlighted in the present document are not possible, are not cost effective, do not meet certain operation models and scenarios, may have technology limitations, or are not cost effective.

DETAILED DESCRIPTION OF THE INVENTION

In the following sections we describe the various invention techniques to achieve an efficient, multiple channel receiver.

Figure 8:
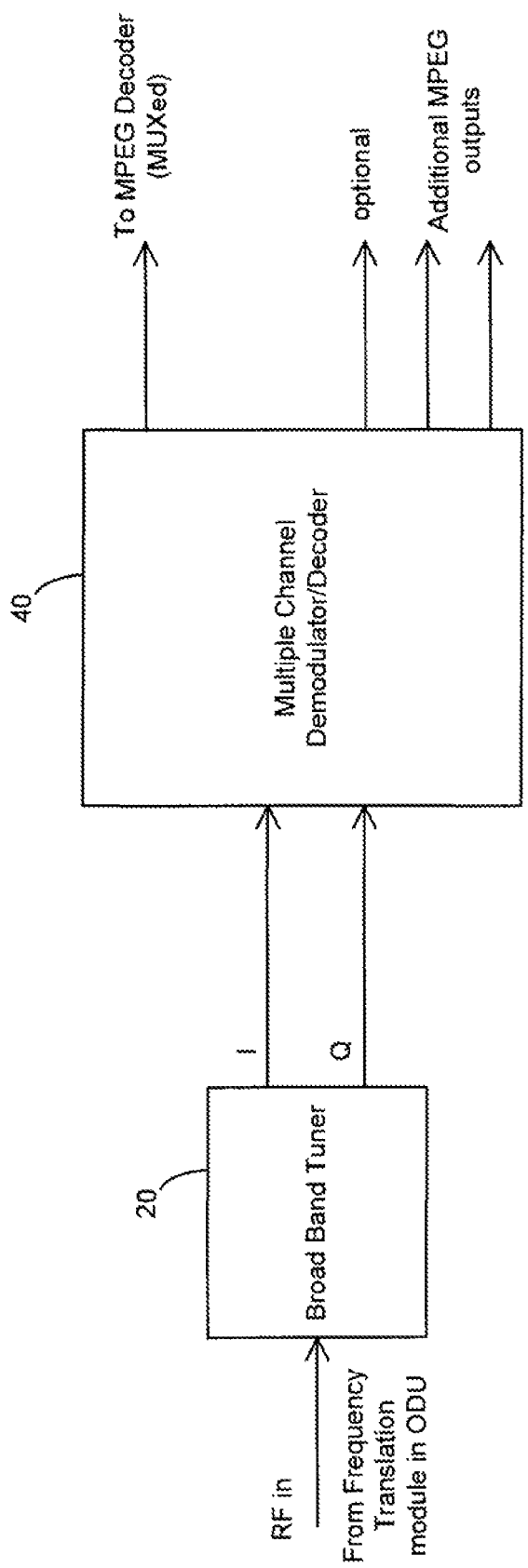
FIG. 8 shows a broadband tuner and multi-channel demodulator and decoder according to the present invention.

FIG. 8 shows a new method for demodulating multiple transponder channels. In this scheme, all the desired transponder channels to be demodulated from all the relevant satellites and polarizations are contained in a limited spectral section. The conversion of the desired transponders from the arbitrary frequency locations in multiple satellites and polarizations to a given section of bandwidth can be performed by a Frequency Translation Module (FTM), also known as a signal selector and combiner, located in the outdoor unit. An example system is described in co-pending U.S. patent application Ser. No. 10/289,011 "Signal selector and combiner for broadband content distribution" filed Nov. 6, 2002 subject to common assignment as the present application and incorporated herein by reference.

The FTM accepts commands from the one or more STBs for the selection of the desired transponder channels and translates these transponder channel signals to a contiguous section of bandwidth or other frequency band configurations that can be provided to the indoor units over a single IFL or multiple cables. The translated transponder channel signals do not necessarily have to be in a contiguous frequency band or even on the same IFL cable (since the system can support more than one IFL cable).

Figure 1:
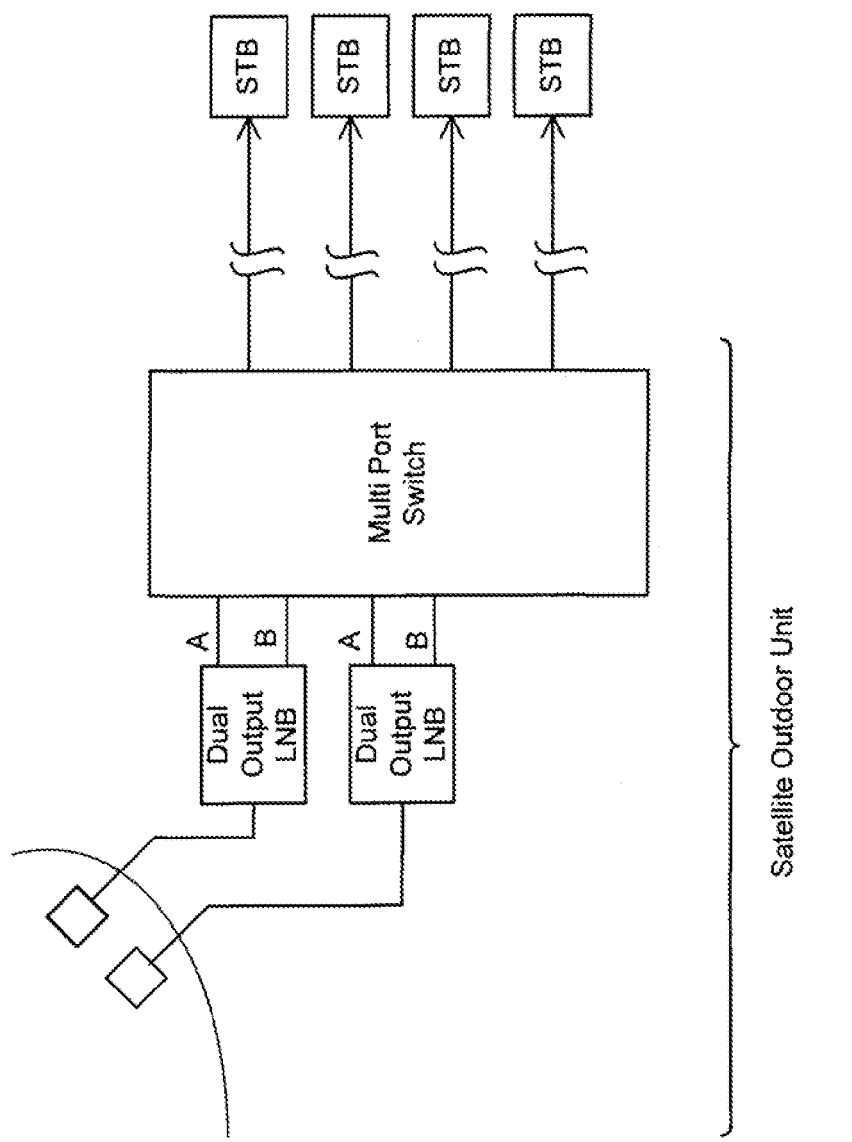
FIGS. 1-5 show prior art configurations of satellite receiving systems, signal distribution, and processing.
Figure 2:
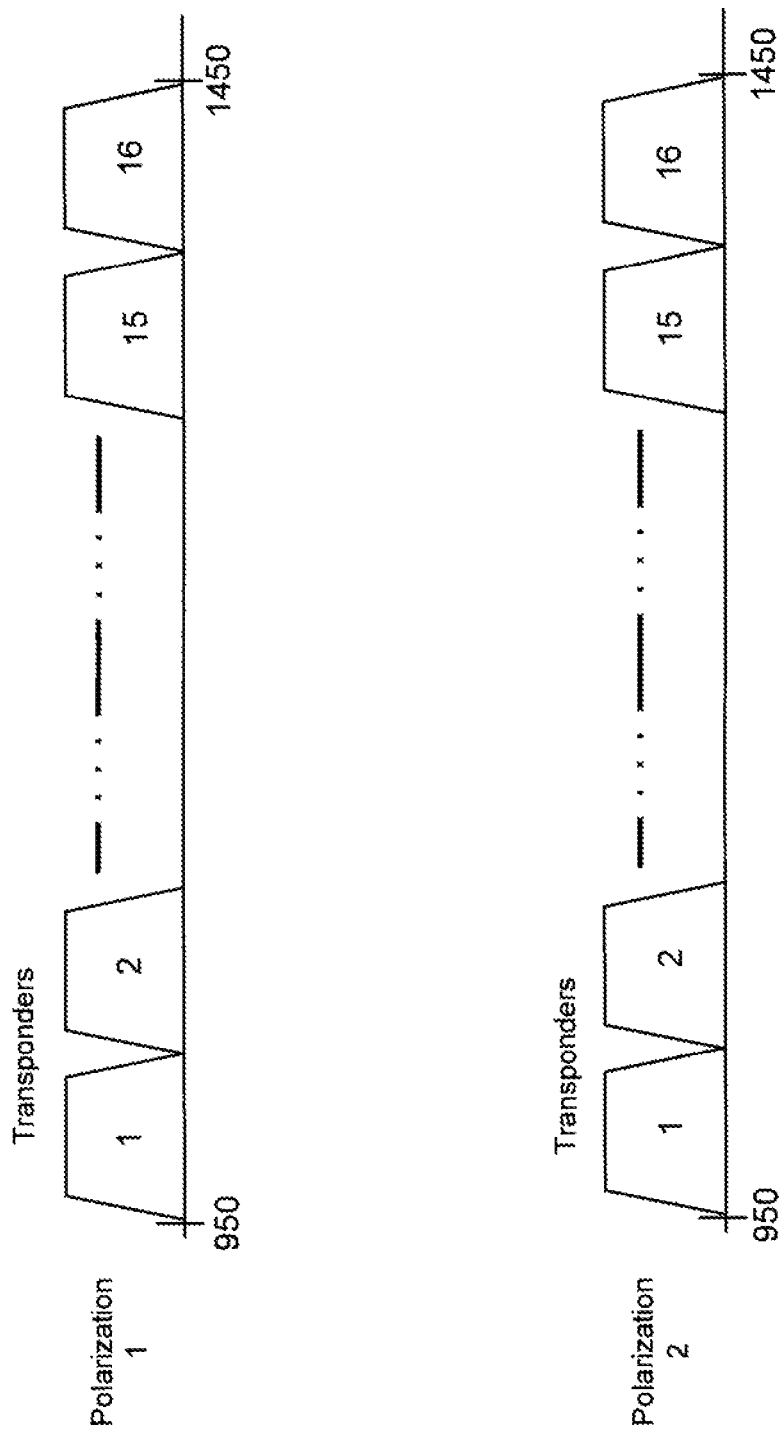
Figure 3:
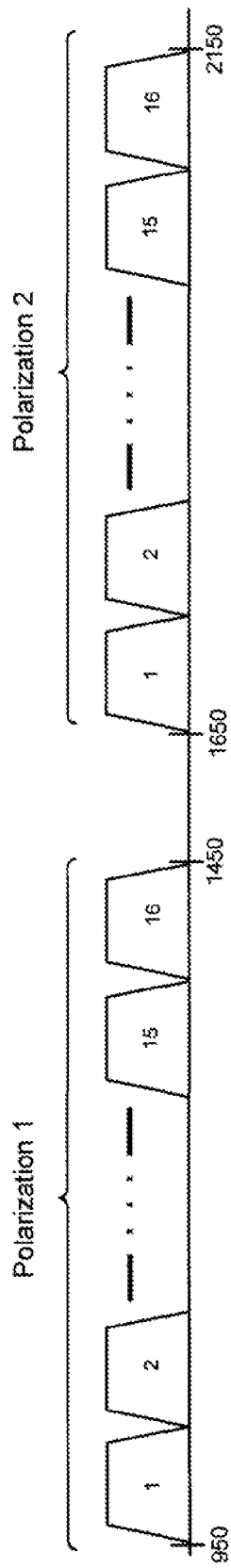
Figure 4:
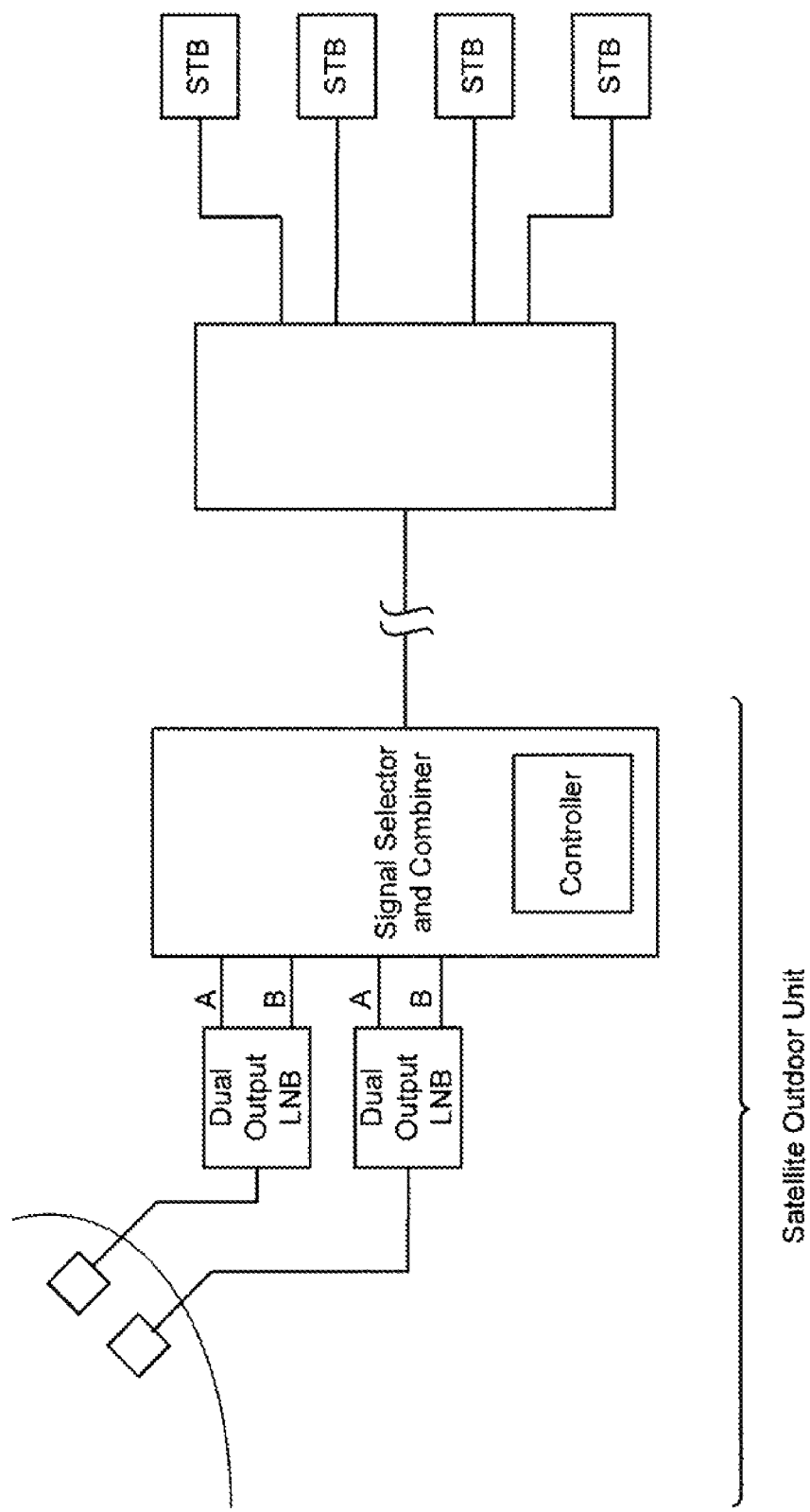
Figure 5:
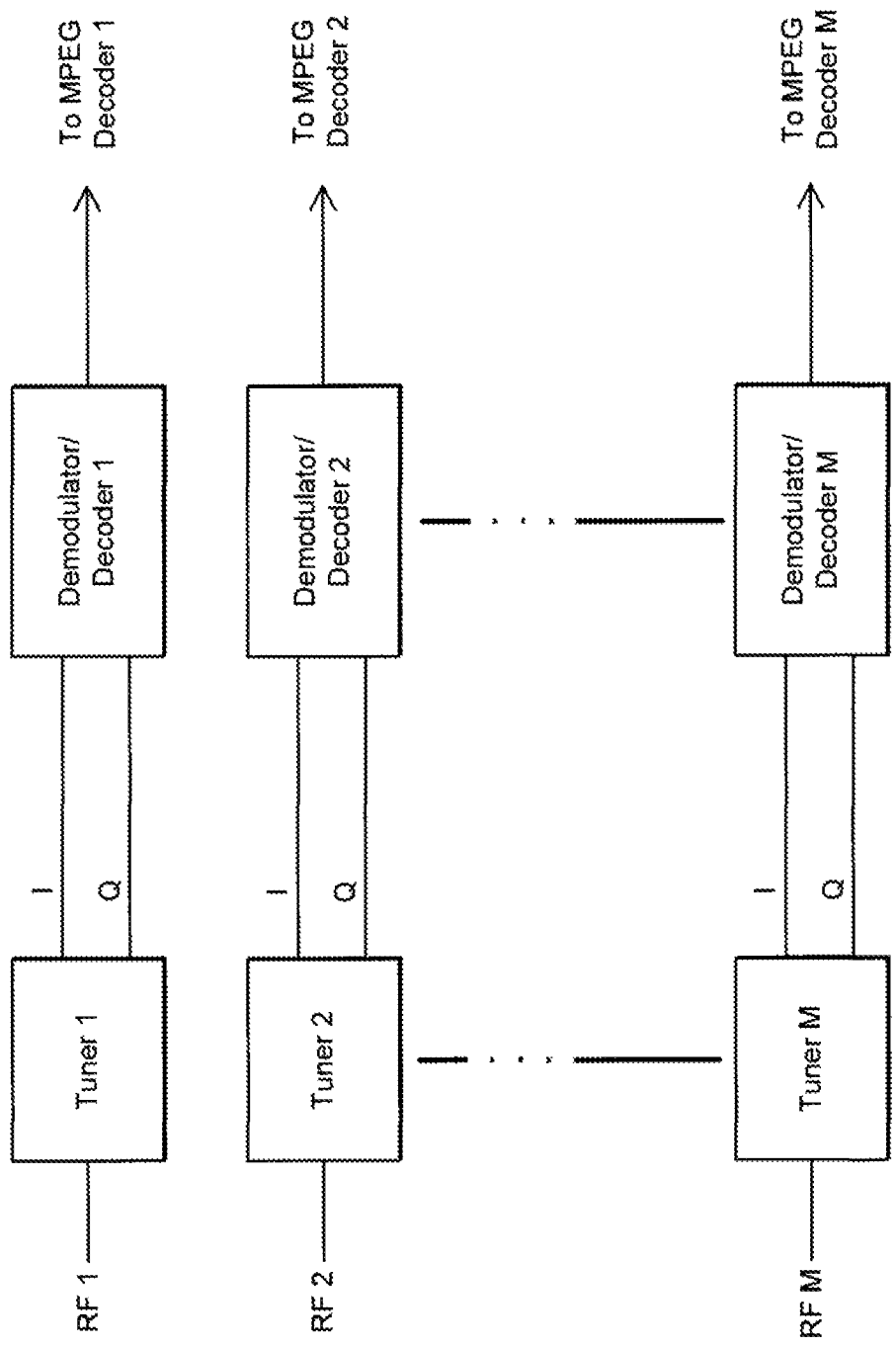
Figure 6:
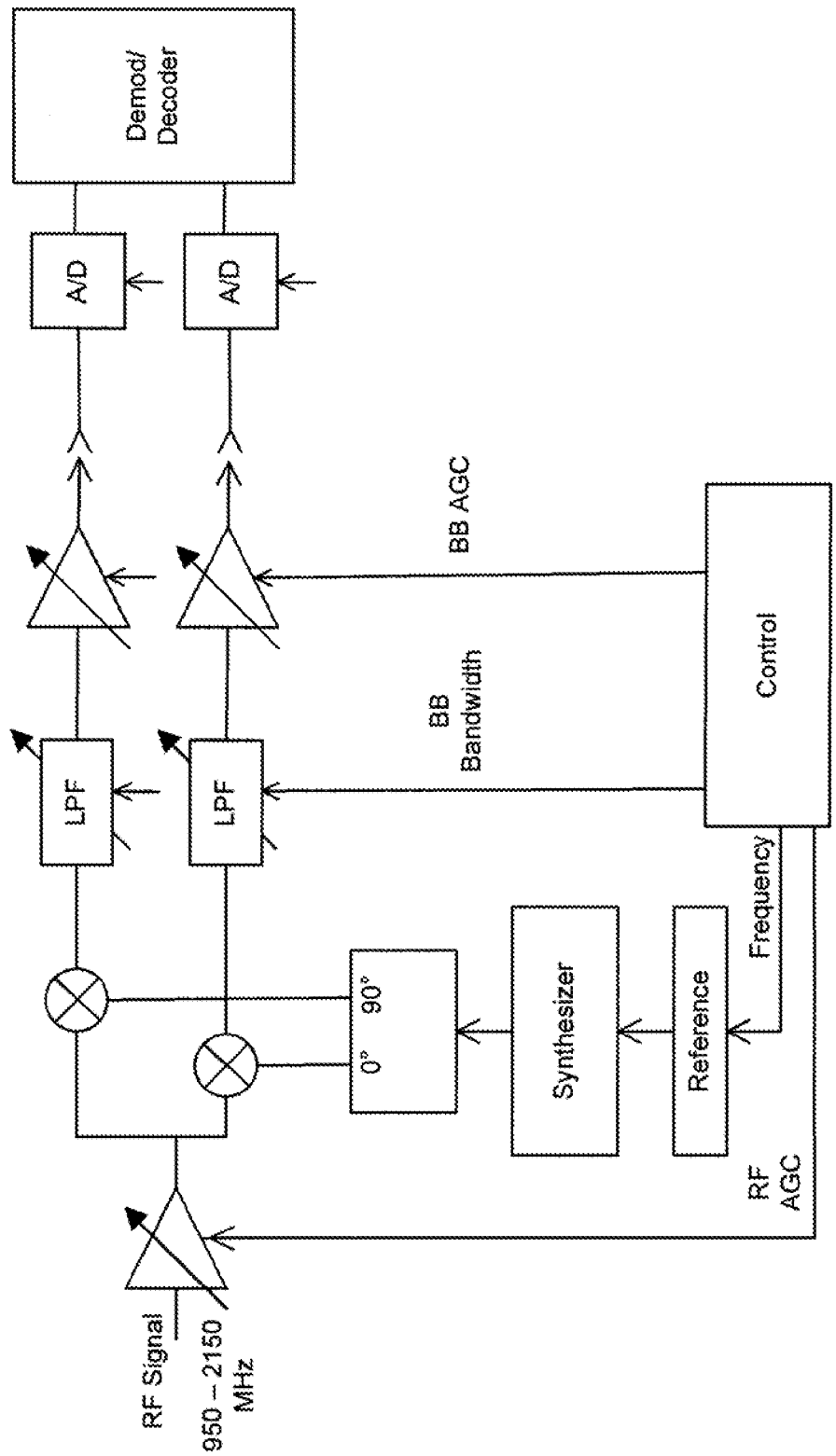
FIG. 6 shows a prior art tuner architecture.
Figure 7:
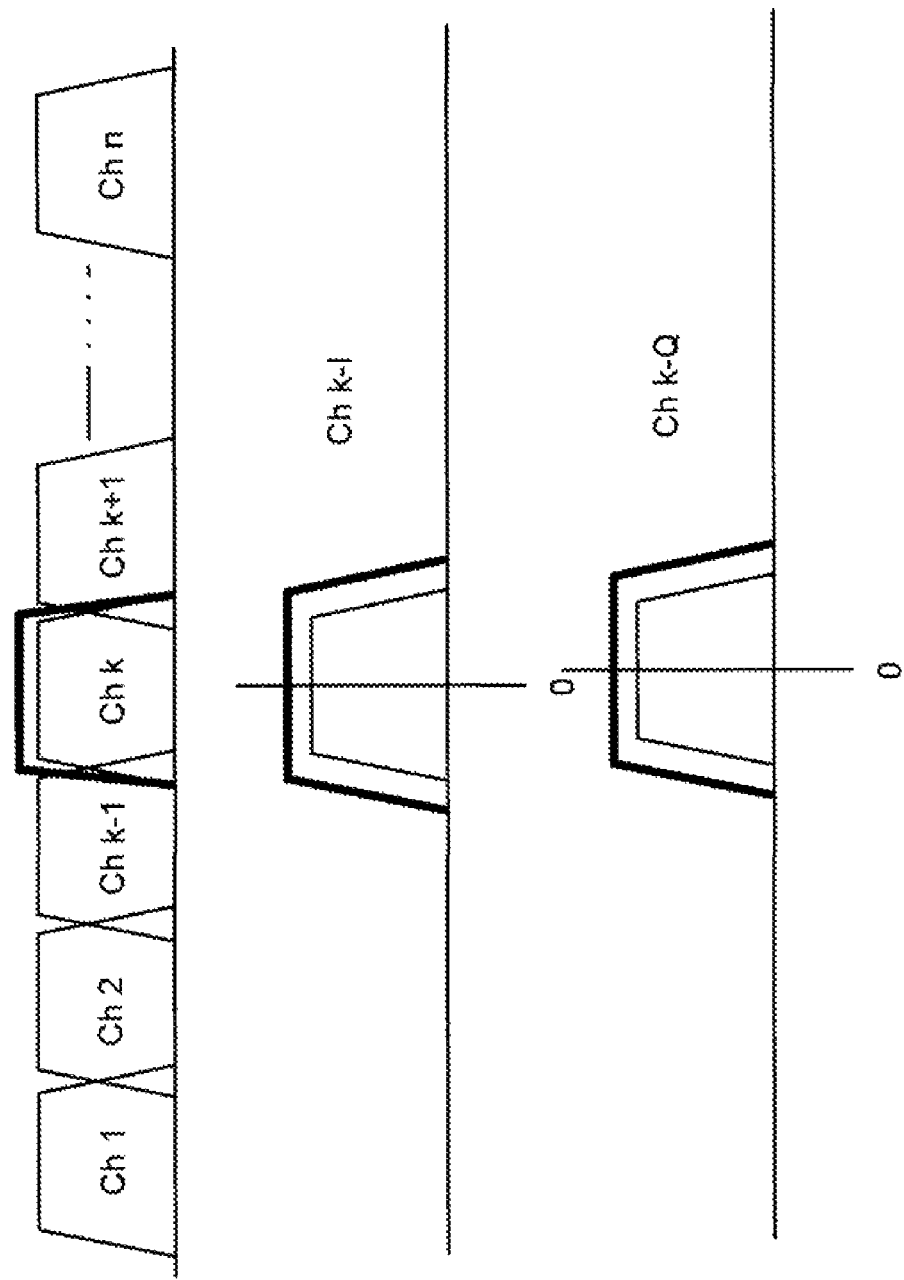
FIG. 7 shows the spectrum of the signals of prior art transponder channel tuning and selection.

As shown in FIG. 8, instead of using multiple tuners to tune to the multiple transponder channel signals, as is the case in the prior art shown in FIG. 5, only one broadband tuner 20 is required in the new invention configuration to tune to the multiple channels selected by the FTM and which are provided to the indoor unit over the IFL cable. Alternatively, multiple tuners can be used to translate sections of bandwidth for demodulation by multiple broadband demodulators described in the present invention. The number of tuners can be anywhere between one to the number of transponder channels. The configuration depends on the final details of a particular system. In the present invention, we provide the example of a single broadband tuner, but any other combination of tuners is applicable. The digital output of the broadband tuner (or tuners) is processed by a multiple channel demodulator and decoder 40 to produce one or more MPEG streams comprising multiple video programs derived from the selected transponder channels. The multiple channel decoder includes an iterative error correction decoder that operates on all the selected channels.

Figure 9:
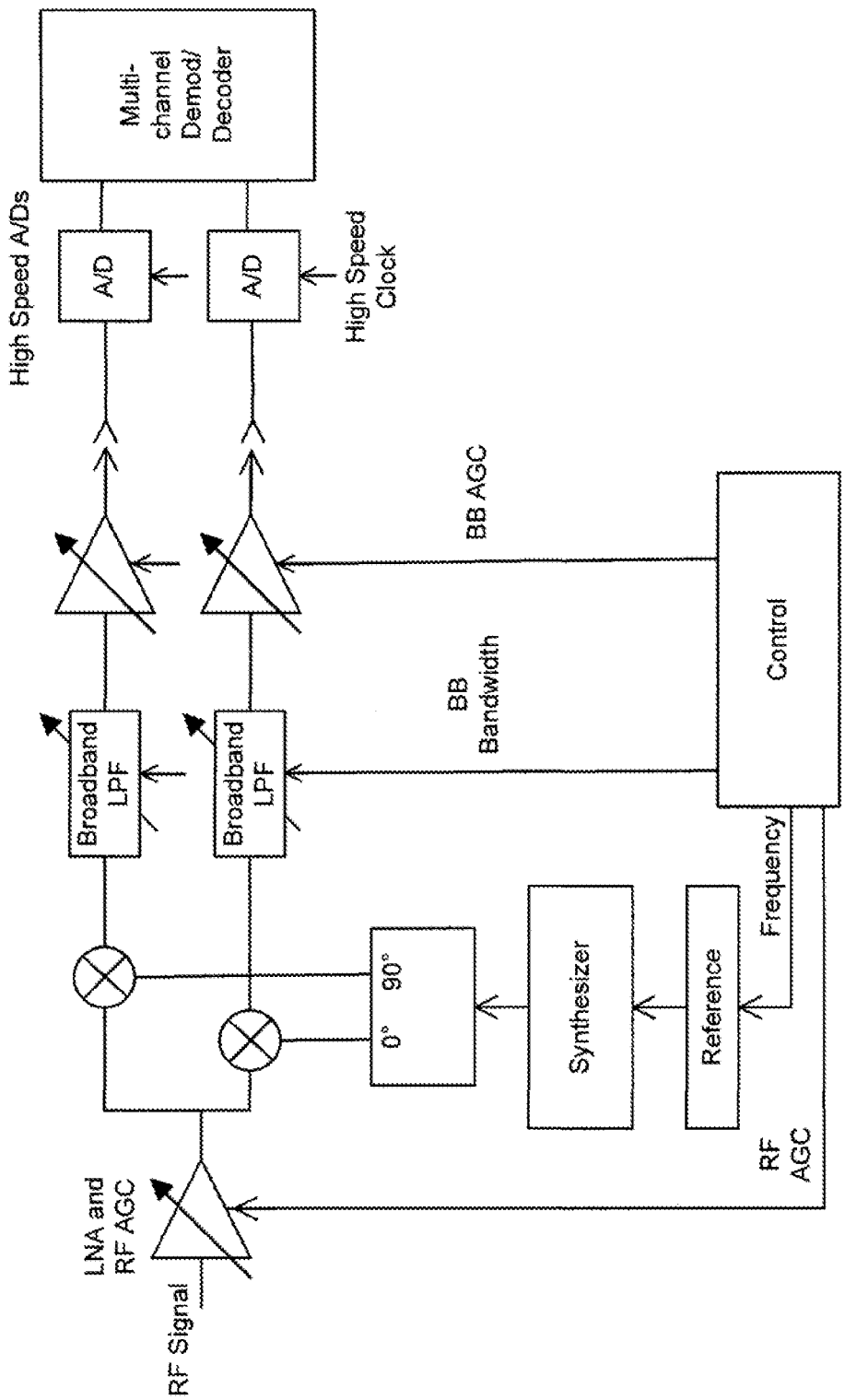
FIG. 9 shows a broadband tuner for use with the present invention.

FIG. 9 shows the block diagram of a broadband tuner. Its general structure and architecture is similar to narrowband tuners; however, there are certain distinctions. Since it is likely that all the desired channels are contiguous and their locations may not change (since the FTM may keep a channel spectral location every time a new channel is selected), then instead of a synthesizer, one can use a fixed local oscillator, thus reducing the cost and complexity of the new tuner. Also, the baseband filters are much wider to accommodate the required spectrum that may include now multiple transponder channel signals compared with the legacy channel selection where only a single transponder channel signal is selected. The A/D converters operate at a high speed necessary to sample the broadband I and Q outputs from the tuner down conversion process.

Figure 10:
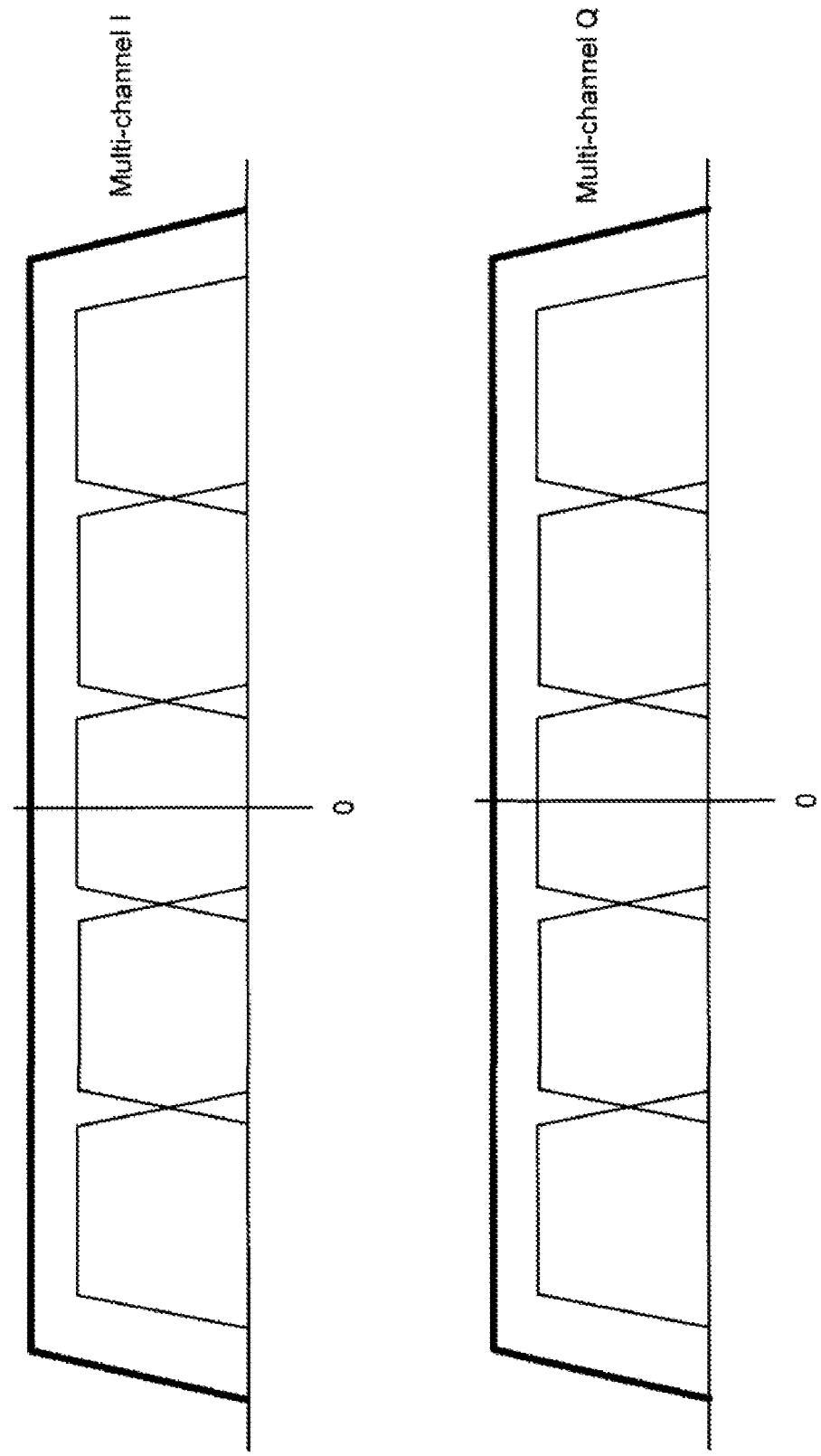
FIG. 10 shows channel tuning and selection of the broadband tuner.

FIG. 10 shows the spectral content of the signals in the broadband tuner. As can be seen in the figure, the tuner processes and passes multiple transponder channels to the A/Ds to be aggregately processed by the broadband demodulator.

Multiple Iterative Decoding

Iterative decoders are Forward Error Correction (FEC) decoders that utilize iterative decoding techniques to achieve communications capabilities that approach the Shannon theoretical channel capacity. Various coding schemes are currently employed including turbo codes, Low Density Parity Check (LDPC) codes, and others. The common decoding technique involves iterative processing, where the decoder performs multiple iterations on the received information and utilizes the new result of each iteration to refine its information for improving the next decoding iteration. The iterative process terminates after the decoder determines that the receive information has been properly decoded or another stopping criterion has been met; the decoder may determine that additional iterations cannot improve the decoding results or a pre-determined maximum number of iterations have been performed. The maximum number of iterations performed is usually determined as a trade-off of performance requirements, processing delay and implementation complexity. More decoding iterations can improve (for example, BER) performance but requires more complex processing and results in a larger delay. The tradeoff usually ends up with a decoder where increasing the maximum number of iterations results in a very marginal improvement in decoding performance and does not warrant the increased implementation complexity.

Various iterative decoder stopping rule algorithms are known and described in the following documents, each incorporated herein by reference: United States Patent Application 20010052104, Xu, Shuzhan J. et al., Dec. 13, 2001 entitled "Iteration terminating using quality index criteria of turbo codes"; U.S. Pat. No. 6,898,254, Wolf et al. May 24, 2005 entitled "Turbo decoder stopping criterion improvement". B. Scanavino, G. Maggio, Z. Tasev, and L. Kocarev, "A novel stopping algorithm for turbo codes based on the average a posteriori entropy," In *Proceedings IEEE Globecom Conference*, Dec. 1-5 2003, pp. 2051-2055.

Many techniques are known for stopping LDPC decoding, for example, verifying consistency between the parity bits and the information code bits. Additionally, hard decisions formed on every bit in a codeword from soft decisions that are outputted at every iteration for every bit in the codeword can be checked if the rendered hard decisions result in a valid codeword.

The complexity, power consumption, and die size of iterative decoders integrated circuits (ICs) is highly dependent on the numbers of iterations required to decode a codeword. A single channel decoder requires a processing engine that is capable of providing as many iterations as necessary to achieve the desired performance.

Figure 11:
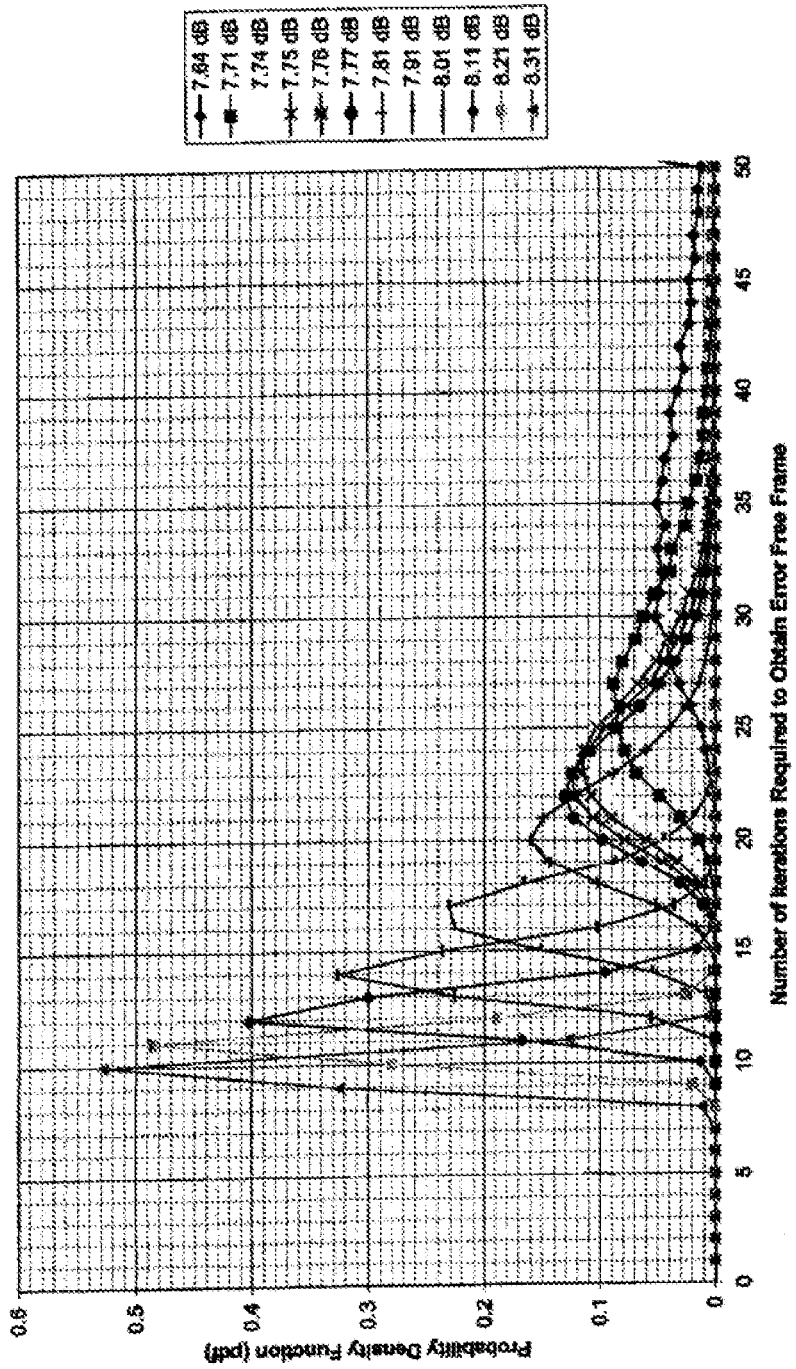
FIG. 11 shows probability densities of iterations required to deliver error-free decoding outputs evaluated at various signal to noise ratios, for a DVB-S2 (LDPC) decoder.

FIG. 11 illustrates the statistical nature of the iterative processing demonstrated by iterative decoders. The Fig. shows the simulation results of the number of iterations required to achieve error-free decoded output codeword (frames) for a concatenated encoded system. The example concatenated encoded system consisted of a Bose-Chaudhuri-Hocquenghem (BCH) outer code and an LDPC code inner code. This system is similar to the rate ¾, 8-PSK long code used by the DVB-S2 satellite transmission standard. An example BCH decoder is described in U.S. Pat. No. 5,440,570 Wei et al., Aug. 8, 1995 entitled "Real-time binary BCH decoder".

These results demonstrate that the number of iterations is a random number, where the number of iterations required to properly decode any given codeword can be significantly smaller than the maximum number of iterations that must be retained by a decoder to guarantee near error free decoding for all code words, or any other given performance level. Moreover, the results also indicate that the average number of iterations that a decoder would use is smaller than maximum number that must be retained for worst-case code words. A processing engine that is required to be able to perform the maximum number of iterations is far more complex than that which is required to perform the average number of iterations. A more complex decoder is undesirable because it has some combination of higher power consumption, higher clocking speed, and increased circuit size. Decoding several independent channels using a single engine enables the sharing of the iterations processing among all the decoder operations, because, as the number of channels increase, the total number of iterations required for decoding all the channels approaches the average number of iterations times the number of aggregately decoded channels. Combining error correction processing of many independent channels into a single, high capacity decoder thus reduces the total processing variance, and therefore reduces the peak number of total iterations required to decode all the channels. The resulting number of iterations needed approaches the average number of iterations times the number of needed decoders.

Another important factor that further enhances decoding efficiency of shared decoding of multiple channels is the fact that the signal to noise ratio (SNR) of the various independent channels may be quite different. The reason for such a difference is the fact that it is very difficult to accurately maintain a given power level of the multiple transponders in a satellite as well as the noise Fig. (NF) and gain of the receiver's LNB, across all service frequencies. The differences within one polarization and one satellite can be small (within 1-2 dB), but once an FTM switch is introduced, the difference between the reconstituted channels can be several dB because transponder channels may be selected from different polarizations and on different satellites.

Figure 12:
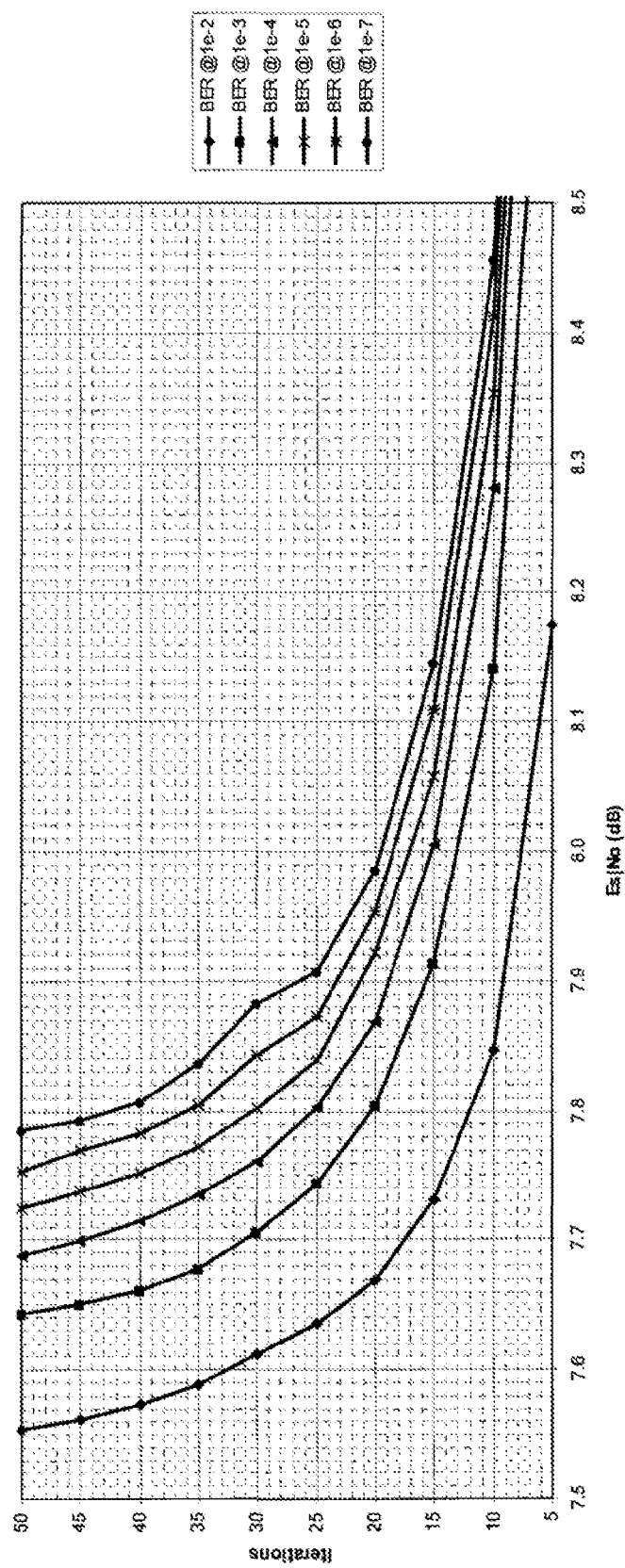
FIG. 12 shows maximum number of decoding iterations necessary to achieve certain average bit error rates, versus signal to noise ratio, for an LDPC decoder.

FIG. 12 shows single-channel simulation results for a DVB-S2 iterative decoder, where the maximum number of iterations available for decoding is plotted as a function of the symbol energy to noise ratio ($E_s/N_0$), and evaluated at several different target output bit error rates (BER). This simulation demonstrates that a decoder that is capable of providing a maximum of 45 iterations requires $E_s/N_0$ of 7.7 dB to achieve an average BER of 1e-4. However, the same BER performance requires only a maximum of 15 iterations at $E_s/N_0$ of 8.0 dB. Hence, for a 0.3 dB increase of $E_s/N_0$, a decoder can achieve the same performance with about 66% less iteration capabilities. Such an attribute cannot be taken advantage of when a single decoder is being used since the additional 0.3 dB in performance improvement can be very important for proper system operation. However, in a multiple decoder system, where the different decoded channels are likely to operate at different SNRs, even with very minor SNR differences of as little as 0.1-0.5 db, the different channels are likely to require a significantly different number of iterations. Hence, a multi channels decoder whose processing can be shared among the various decoded channels can significantly reduce the total number of iterations required to achieve a certain performance as compared to a multi channel decoder where the processing among decoders cannot be shared.

Figure 13:
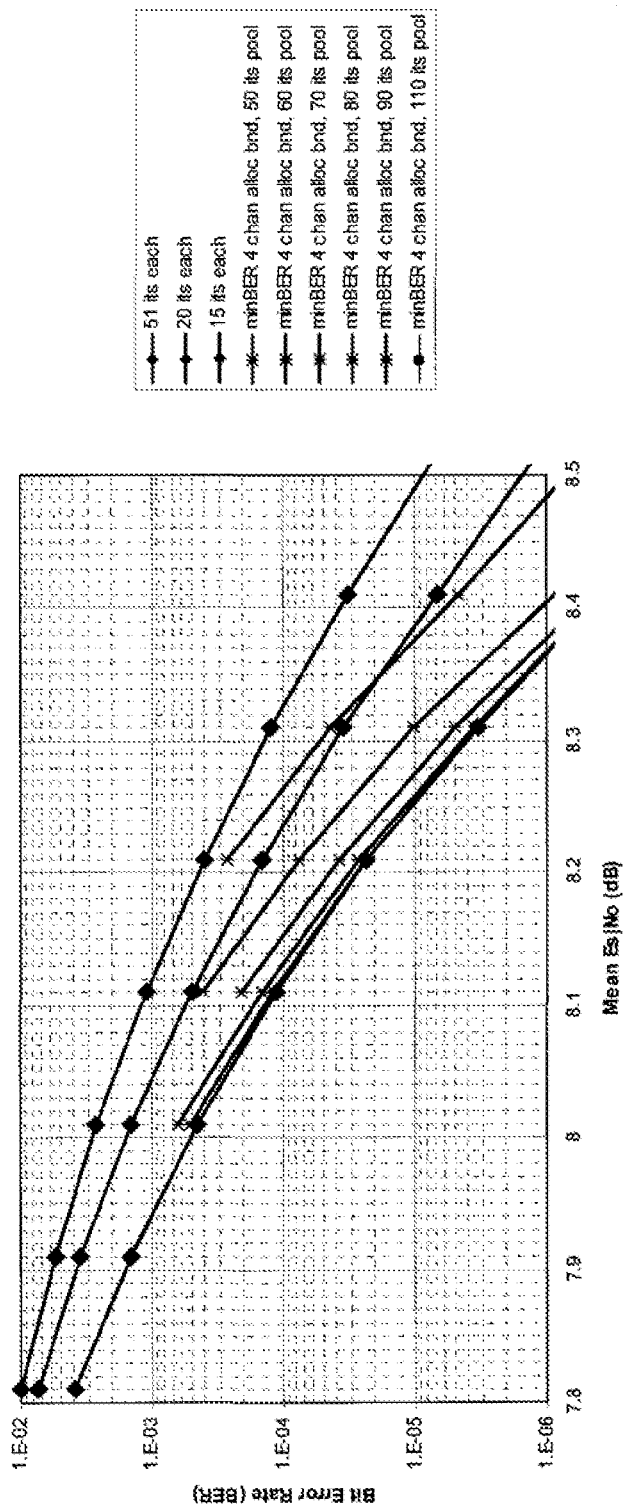
FIG. 13 shows bit error rate versus average signal to noise ratio, when the signal to noise ratio is normally distributed with 0.2 dB variance, parameterized by various decoding strategies including fixed iteration decoders and multiplexed decoder with various iteration pool capacity according to the present invention.

FIG. 13 demonstrates further advantages of sharing iteration processing in a multiple decoder system and with channels of different Signal to Noise Ratios (SNRs). In this Fig. the BER performance vs. the mean $E_s/N_0$ of a simultaneous decoding of 4 channels of 8 PSK, DVB-S2 LDPC rate 3/4 decoders for the long (64800 bit) codeword. In this example, every decoded codeword is randomly sampled (before decoding) from a normally distributed $Es/N_0$ source, with a mean $E_s/N_0$ as indicated in the x-axis and an $E_s/N_0$ standard deviation of 0.2 dB. As can be seen from the figure, with a total number of iterations as little as 80 per codeword period, to decode 4 channels, the BER performance is practically identical to that of a single decoder with 51 iterations for each channel, for a total of 204 iterations capacity. This represents savings of nearly 60% in the total number of iterations required to decode 4 channels with a common decoder compared to 4 separate decoders.

Figure 14:
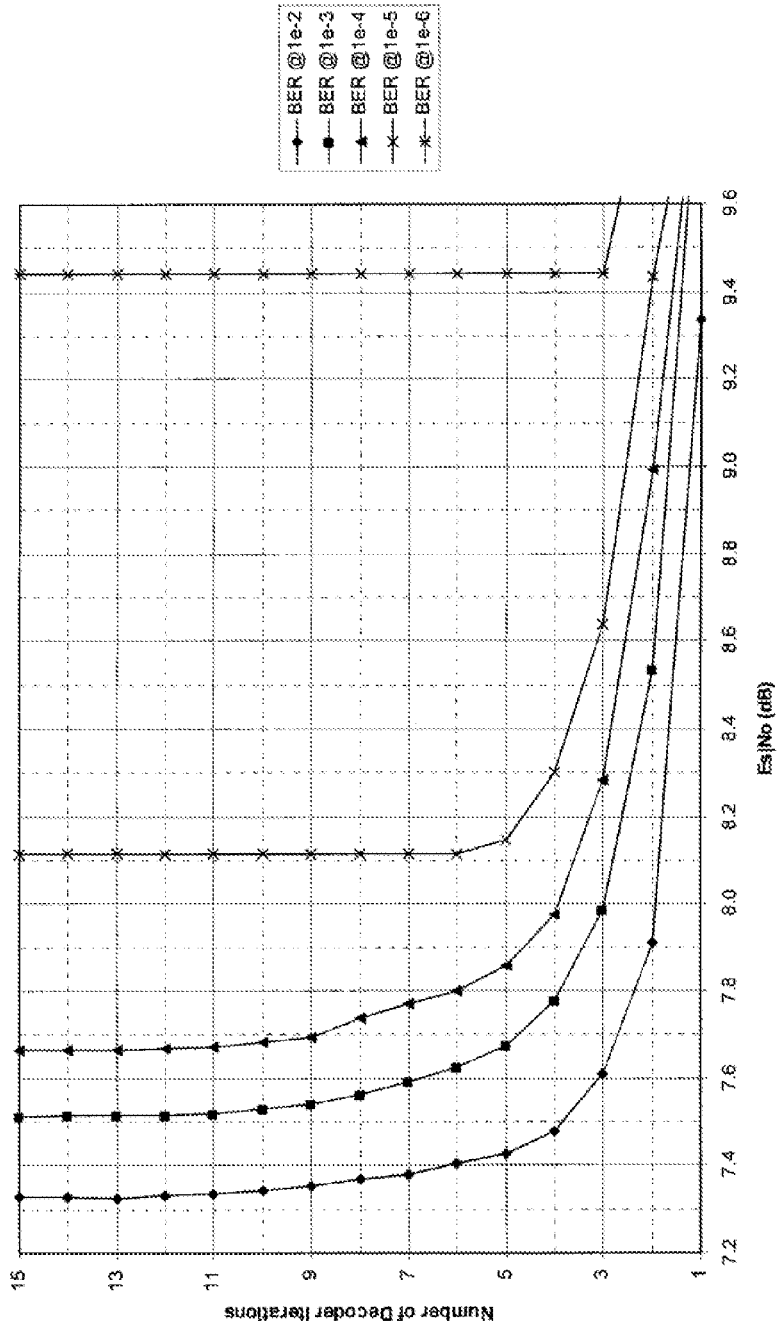
FIG. 14 shows maximum number of decoding iterations necessary to achieve certain average bit error rates, versus signal to noise ratio, for a Turbo Trellis Coded Modulation (TCM) decoder.

FIG. 14 shows similar results as FIG. 12 for a Turbo Trellis Coded Modulation (T-TCM) decoding. A Turbo TCM code is a different type of code that is usually iteratively decoded. The Fig. demonstrates that the same behavior will occur with any iterative decoding scheme and thus the invention is very general and is applicable to all iterative decoders.

Broadband Demodulator Architecture

Figure 15:
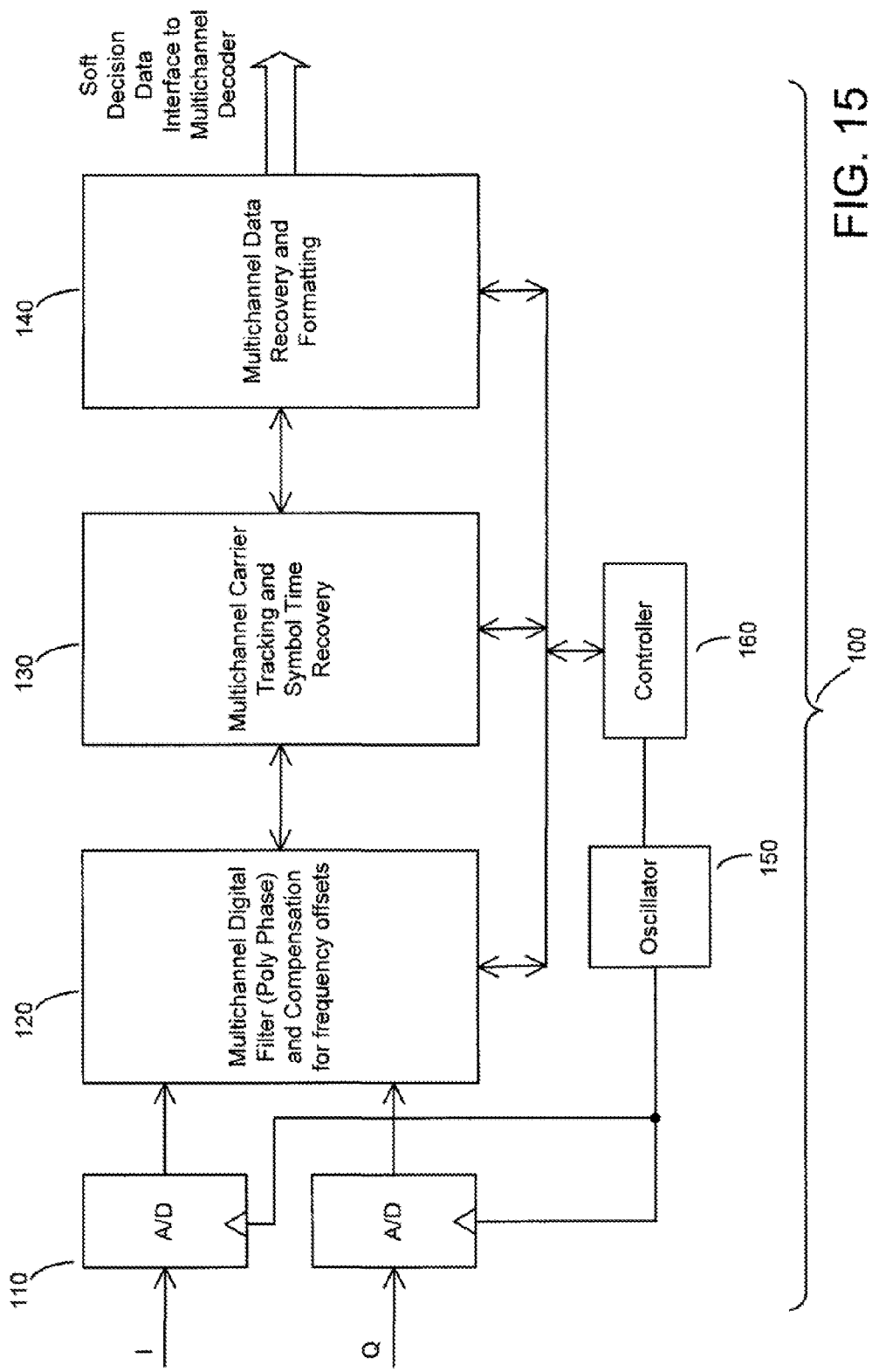
FIG. 15 shows a block diagram of a broadband demodulator with aggregate multi-channel demodulation/decoding capability according to the present invention.
Figure 16:
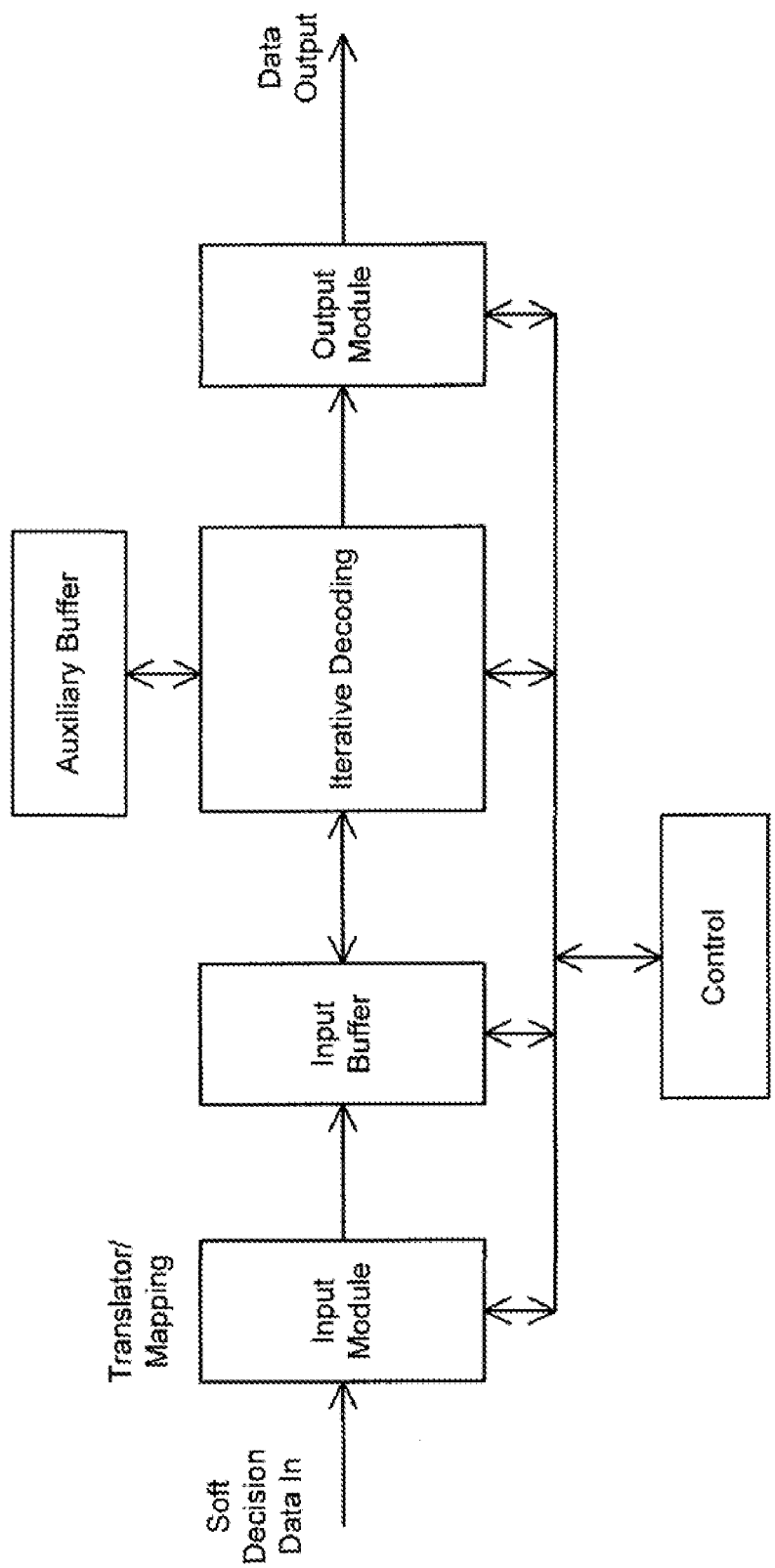
FIG. 16 shows a block diagram of a prior art iterative error correction decoder.
Figure 17:
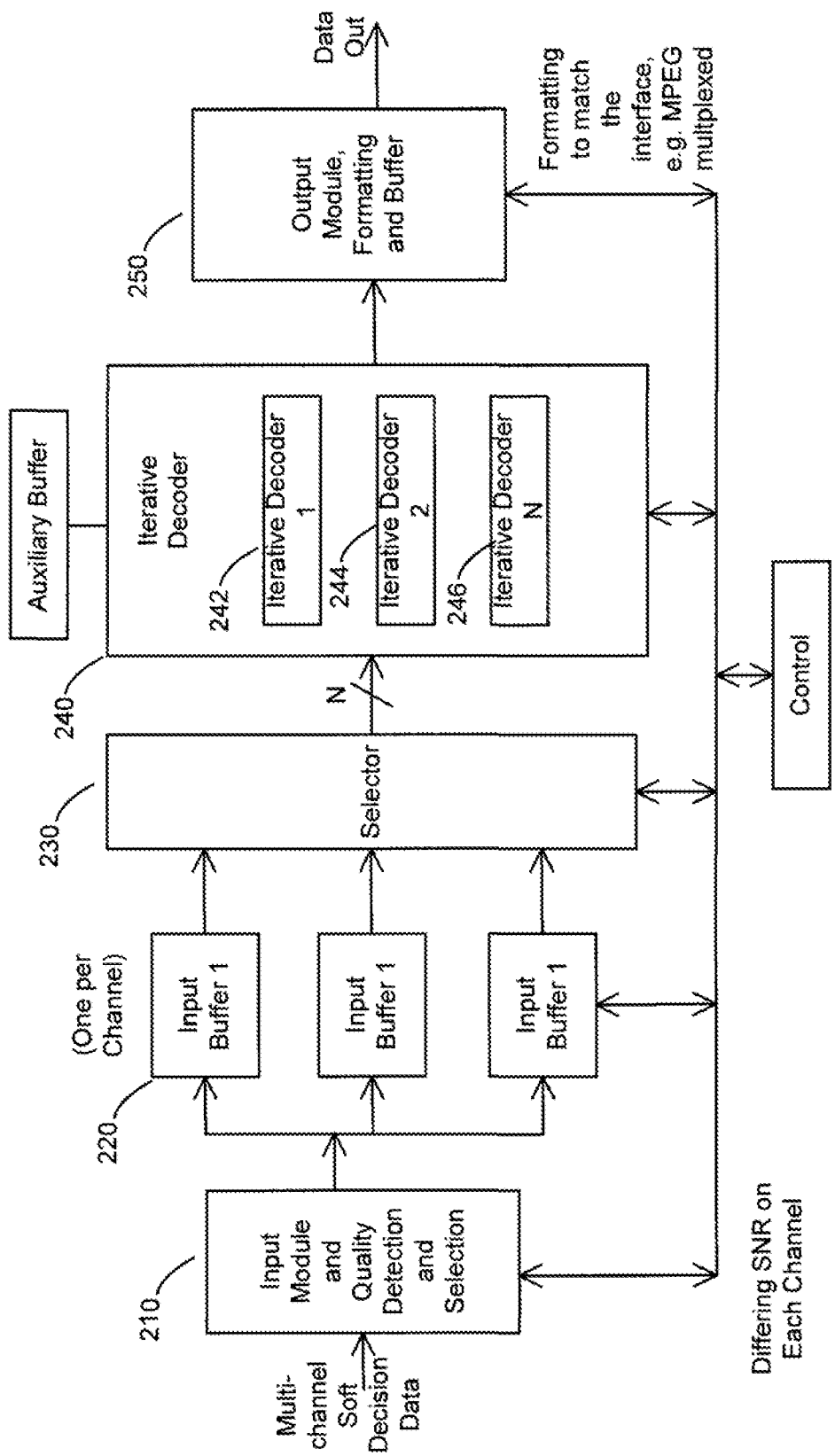
FIG. 17 shows a block diagram of multi-channel, multiple iteration decoders with pooled resources according to the present invention.

FIGS. 15 through 17 illustrate the contents of the Multiple Channel Demodulator/Decoder portion of FIG. 8.

FIG. 15 shows the block diagram of the preferred implementation of the Broadband Demodulator portion. It includes high speed I and Q analog to digital conversion (A/Ds) 110 that digitize the baseband I and Q components. These I, Q components contain several transponder channels for demodulation processing. Following the digitization, the samples are processed by multi-channel digital filter unit 120 (such as a multi-channel poly-phase filter) and all the necessary rotation/down-conversion. Since the Frequency Translation Module (FTM) in the ODU selects transponder channels from satellites, it likely that these different satellites have different frequency offsets due to their individual LNB offsets. Hence, the multi-channel filter unit 120 may perform the necessary frequency offset correction that may aid the frequency acquisition process when switching channels.

The multi-channel carrier tracking and symbol time recovery circuitry 130 performs the traditional carrier tracking and symbol timing extraction associated with QAM/PSK coherent demodulators. Following the carrier and symbol timing recovery and tracking process, the demodulator 140 processes the constellation samples and provides the soft decision bits required for forward error correction decoding. The number of soft decision bits in each sample delivered by demodulator 140 typically ranges from 4 to 6. A/D quantization can range from 6-9 bits and depends on the modulation type. Lesser numbers of soft decision bits can be used in applications where greater levels of quantization degradation are acceptable. The broadband demodulator circuit 100 also contains oscillator 150 to drive the A/D sample clock and any internal clocking needed in other components and controller 160 to set processing parameters of the blocks.

The demodulation steps described above include well-known techniques that are discussed extensively in the literature including in the books "Signal Processing in Telecommunications" by Biglieri and Luise, "The Theory and Practice of Modem Design" by Bingham and "Multirate Signal Processing for Communication Systems" by harris.

Method for Multi Iterative Decoder Processing

Iterative decoding of LDPC codes and turbo codes provides enhanced decoding performance, which is attractive in many wireless applications including Direct Broadcast satellite (DBS). Decoding techniques of such codes are well known and can be found in contemporary communications and coding books and scientific literature.

FIG. 16 shows a simplified prior art block diagram of a typical iterative decoder. The decoder receives soft decision bits from the corresponding demodulator and buffers the information for processing. An iterative decoding unit processes the input information and extracts relevant information, which is stored in an auxiliary buffer. The decoder then utilizes the processed information and the original stored soft decision to start a new decoding iteration. The iterative-decoding of low-density parity-check codes is typically halted after a valid codeword is found, or after a maximum number of iterations have been completed.

FIG. 17 shows the block diagram of a multi-channel iterative decoder according to the present invention. The decoder is constructed to process multiple channels through a common decoding resource and take advantage of the statistical nature of the decoding process and the potential difference in the signal to noise ratios of the channels in order to enhance decoding efficiency. Viewed from the input to output, all channels are processed simultaneously with latency introduced; however, the processing of each channel is done sequentially through the iterative decoder.

The multiple channels are processed by an input module 210 where the soft decision bits of each channel are processed and a channel quality measure is determined. The quality measure can be signal to noise ratio (SNR); signal to noise and distortion ratio (SINAD); or signal to interference plus noise ratio (SINR). Also, a check can be made of the error rate of an uncoded known code word, such as a synchronization word. The soft decision data are then buffered in separate input buffers 220 with the associated quality measure. One or more buffers are provided for each channel to be decoded. The buffers are logically separated for each input channel; however, the buffer can be implemented in one memory block with pointers for each buffer area.

Coding is done by the transmitter on data blocks of predetermined block size. The received data is stored with identified block boundaries and decoding is done on integral blocks of coded data. Block sizes can range from small to large depending on the application, which can be from hundreds to tens of thousands of soft decisions per block. As an example, a DVB-S2 broadcast encoder generates 64,800 code bits per codeword (block), and each coded bit requires a (log-likelihood) soft decision of 6-bit width at the decoder.

The iterative decoder then processes the multiple channels by selecting blocks of data from the channels one at a time using selector unit 230, processing the block of channel data with the iterative decoder unit 240, and forwarding the decoded information to the output module 250. Depending on the transmission scheme, the output module often may have to re-insert MPEG sync bytes required by the MPEG decoder. In many new formats, these sync bytes can be suppressed by the satellite operator to conserve bandwidth.

In the present description, it is assumed that the iterative decoder 240 processes one channel at a time or one channel per decoder if multiple decoders are provided in the decoder 240. Depending on the specific decoder implementation, multiple channels can be processed at any one time as well. Once the decoder finishes the processing of a channel, it will select a second channel for processing and so on. Multiple decoders within the iterative decoder 240 allow parallel processing of different channels while still taking advantage of the combining. The individual decoders 242, 244, and 246 can be used on an as available basis by the next input channel scheduled for processing. Note that the description above can be modified to allow various options for the number of buffers and how many buffers are available per channel, the number of iterative decoders used, the synchronization between the various channels (they can be time synchronized or not, have common boundaries or not, have identical block size or not, etc), without loss of generality. The basic concept of sharing one or more decoding engines in an iterative deciding system among multiple channels requires small implementation modifications to be adapted to each of the above scenarios.

Data processed by the FEC is generally denominated in terms of code words. Sequences of known sync symbols ('Unique Words') are periodically inserted into the symbol stream every one or more code words to enable demod synchronizing. These Unique Words also provide reference to inner code codeword boundaries for an iterative decoder, such as an LDPC decoder or a turbo-TCM decoder.

Multiplexed Decoder Processing Rule

FIGS. 18 to 21 show flowchart descriptions of the rules for selecting, iterating, and terminating channel decoding for a multi-channel LDPC decoder shown in FIG. 17. Tables 1-3 show example parameter values used in the flowcharts.

Figure 18:
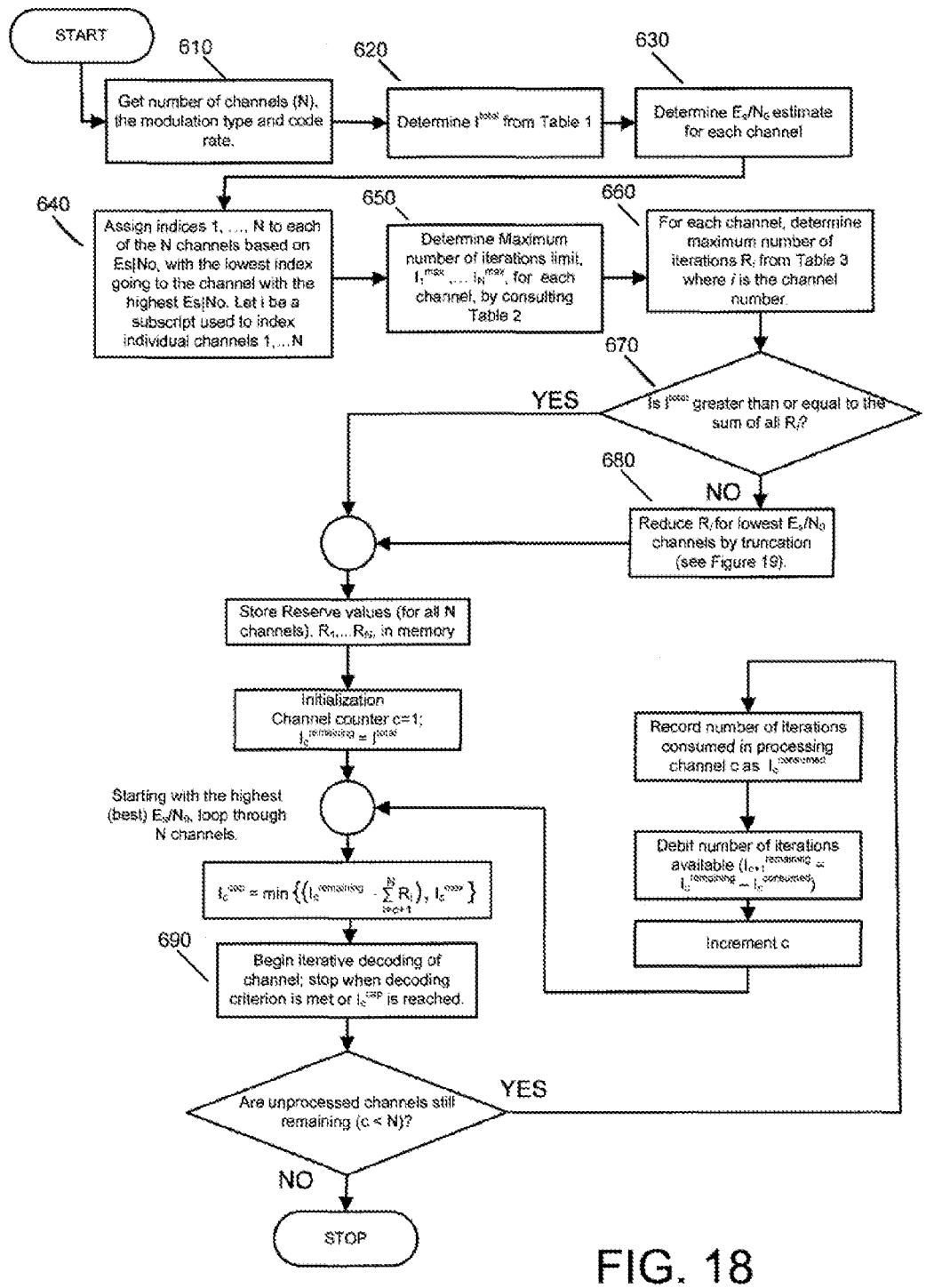
FIGS. 18-21, show flow charts describing iteration allocation in multi-channel, multiple iteration decoders.

FIG. 18 shows the flow of instructions for one version of the multi channel decoding. The first step 610 reads the number of channels, the modulation type, and the code rate. The system is then initially calibrated by reading from Table 1 the total number of iterations, $I^{total}$ that the decoding hardware can execute in processing the N channels (step 620). Since the various channels can operate with different modulation and code rates, the same hardware may be able to perform a different number of total iterations (for example, per codeword) for different modulation and code rate configurations. We assume, without loss of generality, that all of the channels have the same modulation and coding and that the code words among the various channels are fully synchronized in time. These two assumptions are not essential but are used here for simplicity. If the channels have different modulation/coding, the total number can be computed either by a larger table, by adding the individual iterations capable to be performed by each channel to find the total or by similar techniques. Also, if the channel code words are not synchronized, we can either synchronize the channels by buffering the "early" channels or by performing the processing unsynchronized with small, straightforward modifications to the algorithms described.

Step 630 computes the performance metric for each channel, for example $E_s/N_0$, which is the symbol energy to noise spectral density ratio of each of the channels. Such computation is well known and is described widely in the literature. The input code words that are ready for decoding are ranked according to their $E_s/N_0$ (step 640), where the channel with the highest $E_s/N_0$ is indexed first and the channel with the lowest $E_s/N_0$ is indexed last. If a group of channels has identical $E_s/N_0$, they are indexed arbitrarily within the group.

When resources are inadequate to support operation of all channels, that is, when the expected average number of iterations for all channels collectively is greater than the processing resources available, a simple (truncation) mechanism is used to make sure that the worst Es/No channels are not processed.

In an alternate embodiment, when BCH correction stopping is used, Es/No ordering does not necessarily make the decoding scheme any more effective, in terms of minimizing the aggregate BER, and ordering by Es/No may or may not be used.

The maximum number of iterations, $I^{max}$, computed for each channel, and reserve iterations $R_i$ for all the channels are determined in steps 650 and 660 respectively by consulting Tables 2 and 3. The determination of $I^{max}$ and $R_i$ are based on the modulation, code rate and the $E_s/N_0$ for each channel. If the hardware can support all the reserve iterations of all the channels (determined in step 670), the process can proceed. Otherwise, if the hardware cannot support all the reserve iterations, the reserve iterations need to be truncated (step 680) according to the flowchart of FIG. 19 before the process proceeds.

The decoder step 690 starts decoding (iterating) each channel at a time. If a channel decodes 'cleanly', which can be determined, for example, by checking whether an iterative decoding outcome leads to a valid inner code, for example, an LDPC code, or a valid outer code, for example a BCH codeword, or by any other of numerous known and published 'early stopping' techniques, the number of iterations consumed is recorded, and decoding commences on the next channel. The number of iterations allocatable to a given channel's processing is limited by two figures: a) the per-channel limit, $I^{max}$, and b) the difference between the total remaining available iterations (to be allocated among the given channel and the channels yet unprocessed) and the number of iterations that would ensure that all unprocessed channels, excluding the given channel, each receive its reserve number of iterations. This ensures that all channels are allocated at least a reserved number of iterations, but enables a channel currently being processed to borrow iterations beyond its reservation allocation from other channels, if surplus iterations are available. The initialization process guarantees that the total number of iterations available always exceeds the sum of iterations reserved for all channels.

Figure 19:
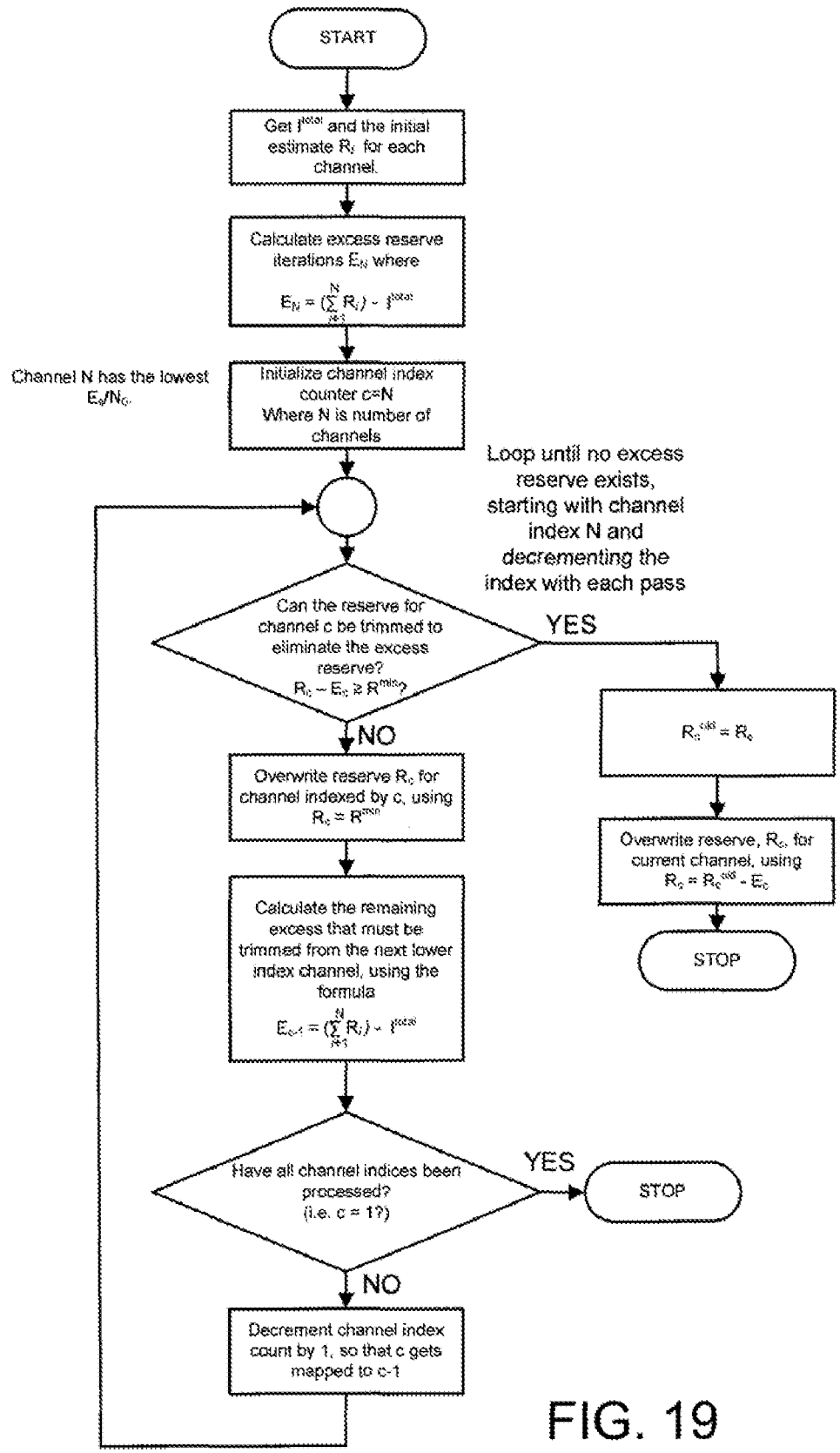

FIG. 19 shows a flow chart for a reserve iteration truncation process (which is used within the allocation algorithm detailed in FIG. 18), for cases where the $I^{total}$ is smaller that the sum of reserve iterations for all the channels. The process is straight forward: it removes iterations from the lowest priority channels until the number of reserve iterations required for all the channels is below the total available $I^{total}$. When truncating from the lowest priority up to the highest, there is a minimum number of iterations $R^{min}$ allocated to each channel. $R^{min}$ can be derived from a lookup table that is a function of transmitted modulation (e.g. 8-PSK or QPSK), code rate, and $E_s/N_0$ inputs. Alternatively, $R^{min}$ may be assigned a static number, such as the values 1 or 0, which may be preferred parameterizations.

Figure 20:
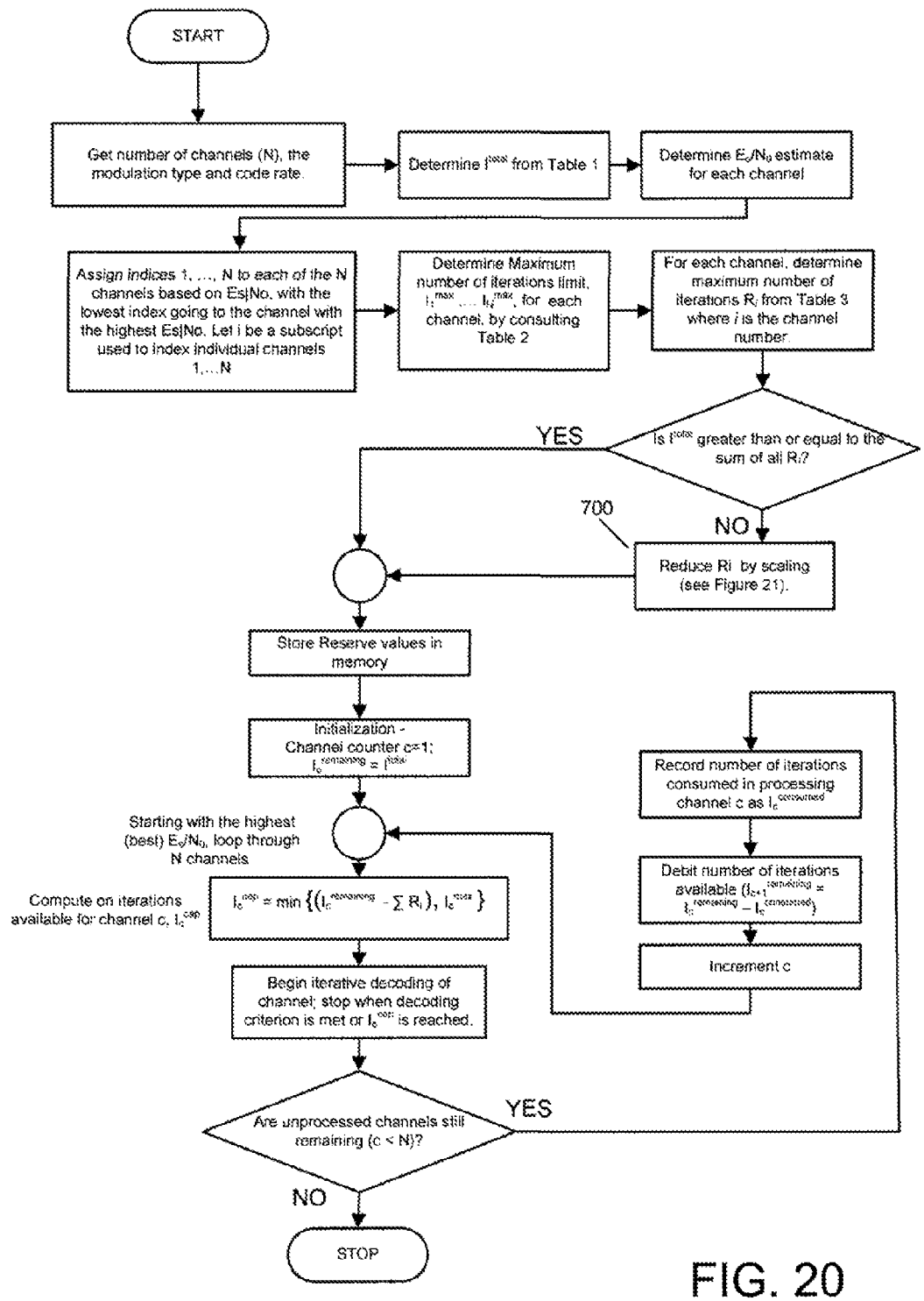
Figure 21:
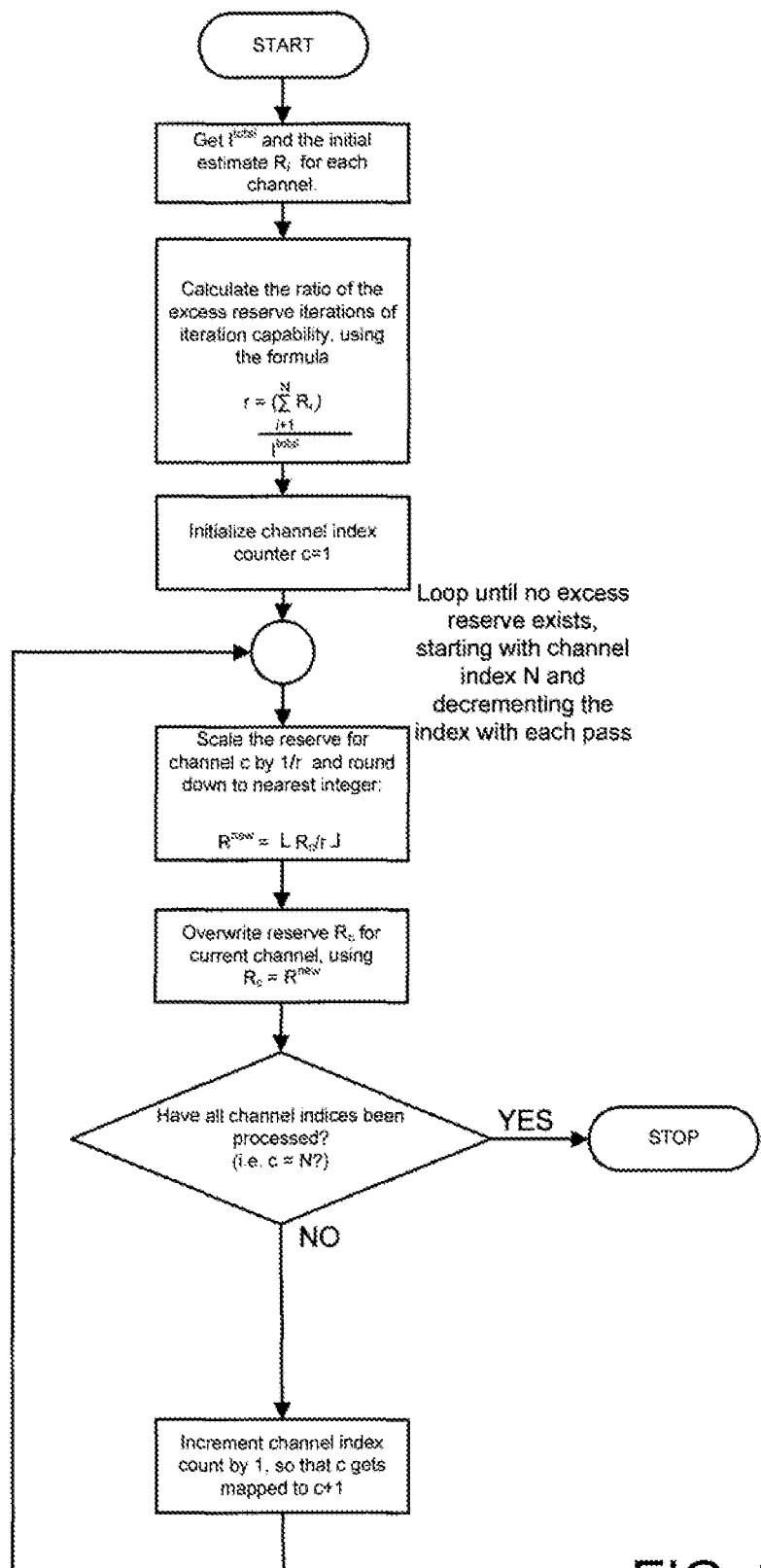

FIGS. 20 and 21 provide flowcharts for the case where the reduction of reserved iterations in order to bring the total below $I^{total}$ is done not by truncation of reserve iterations from the lowest priority channels up, but by a linear reduction of the reserve iterations of all the channels. FIG. 20 provides details on the overall iteration allocation method (analogous to the algorithm detailed by FIG. 18); FIG. 21 provides details on the linear reduction sub-procedure 700 used within the algorithm described in FIG. 20.

TABLE 1

Illustrative Example of Hardware Iteration Capability, $I^{total}$, as a function of modulation type and code rate

| Modulation type and code rate | HW Iteration Capability, $I^{total}$ |
|---|---|
| QPSK, rate ½ | 167 |
| QPSK, rate ⅗ | 123 |
| QPSK, rate ⅔ | 164 |
| QPSK, rate ¾ | 149 |
| QPSK, rate ⅘ | 142 |
| QPSK, rate ⅚ | 138 |
| QPSK, rate 8/9 | 166 |
| QPSK, rate 9/10 | 165 |
| 8-PSK, rate ⅗ | 81 |
| 8-PSK, rate ⅔ | 109 |
| 8-PSK, rate ¾ | 100 |
| 8-PSK, rate ⅚ | 92 |
| 8-PSK, rate 8/9 | 110 |
| 8-PSK, rate 9/10 | 110 |

TABLE 2

Illustrative Example of the max allocation (per channel), $I_i^{max}$ as a function of modulation type, code rate, and Es|No (here only the table for 8-PSK rate ¾ is illustrated)
8-PSK Rate ¾

| Channel Es/No (dB) | Max allocation, $I_i^{max}$, for channel (indexed by i) |
|---|---|
| 6.81 | 1 |
| 6.91 | 1 |
| 7.01 | 1 |
| 7.11 | 2 |
| 7.21 | 2 |
| 7.31 | 3 |
| 7.41 | 50 |
| 7.51 | 50 |
| 7.61 | 50 |
| 7.64 | 50 |
| 7.71 | 50 |
| 7.74 | 50 |
| 7.75 | 50 |
| 7.76 | 50 |
| 7.77 | 50 |
| 7.81 | 50 |
| 7.91 | 26 |
| 8.01 | 21 |
| 8.11 | 18 |
| 8.21 | 16 |
| 8.22 | 16 |
| 8.31 | 13 |
| 8.41 | 12 |
| 8.51 | 11 |
| 8.61 | 10 |
| 8.71 | 9 |
| 8.81 | 8 |
| 8.91 | 8 |
| 9.01 | 7 |
| 9.11 | 7 |
| 9.21 | 6 |
| 9.31 | 6 |
| 9.41 | 6 |

TABLE 3

Illustrative Example of Reserve Iterations held (per single channel), $R_i$ as a function of modulation type, code rate, and Es|No (here only the table for 8-PSK rate ¾ is illustrated)
8-PSK Rate ¾

| Channel Es/No (dB) | Reserve iterations, $R_i$, for a single channel (indexed by i) |
|---|---|
| 6.81 | 1 |
| 6.91 | 1 |
| 7.01 | 1 |
| 7.11 | 2 |
| 7.21 | 2 |
| 7.31 | 3 |
| 7.41 | 50 |
| 7.51 | 50 |
| 7.61 | 42 |
| 7.64 | 38 |
| 7.71 | 28 |
| 7.74 | 26 |
| 7.75 | 25 |
| 7.76 | 24 |
| 7.77 | 23 |
| 7.81 | 21 |
| 7.91 | 17 |
| 8.01 | 14 |
| 8.11 | 12 |
| 8.21 | 11 |
| 8.22 | 11 |
| 8.31 | 10 |
| 8.41 | 9 |
| 8.51 | 8 |
| 8.61 | 7 |
| 8.71 | 7 |
| 8.81 | 6 |
| 8.91 | 6 |
| 9.01 | 6 |
| 9.11 | 5 |
| 9.21 | 5 |
| 9.31 | 5 |
| 9.41 | 4 |

What is claimed is:

1. A method of processing a plurality of satellite channels that are coded with error correction coding, the method comprising:
    selecting the channels for processing using a tuner;
    demodulating the channels to produce soft decision channel data streams;
    storing each channel data stream in an input buffer;
    measuring the quality of each channel signal;
    estimating required decoder iterations for each channel using the quality measurement;
    scheduling iterative decoder operations based on the required decoder iterations for each channel;
    decoding the channel data steams by reading channel data streams from the input buffers and sequentially decoding each stream using at least one iterative decoder engine; and
    storing the decoded channel data streams in an output buffer.

2. The method of claim 1 further comprising setting a limit to the number of iterations preformed by the decoder for each channel data stream based on the quality measured.

3. The method of claim 1 further comprising a plurality of iterative decoder engines wherein the number of decoder engines are smaller than the number of channels, wherein sequential blocks of data are read from the input buffers and decoded one block per available decoder engine.

4. The method of claim 1 wherein selecting the channel signals is performed with at least one broadband tuner, where the number of tuners is smaller than the number of selected channels.

5. The method of claim 1 where the quality measure is related to signal to noise ratio (SNR) of the channel signal, where channels are decoded in order of SNR and the highest SNR channel is decoded first.

6. The method of claim 1 where the quality measure is related to signal to noise ratio (SNR) of the channel signal where the channel requiring the fewest decoder iterations is decoded first.

7. The method of claim 1 where the quality measure is related to signal to noise ratio of the channel signal (SNR) where channels with SNR below a predetermined level are not decoded.

8. The method of claim 1 where the quality measure is related to signal to noise ratio of the channel signal (SNR) where channels with SNR below a predetermined level are not decoded and the channels are decoded in order of SNR and the lowest SNR channel is decoded first.

9. The method of claim 1 where a demodulating unit capable of demodulating more than one channel is employed.

10. The method of claim 2 further using a stopping criterion to stop the decoding before the limit is reached, where the stopping criteria indicates acceptable decoded data.

11. The method of claim 1 where:
the tuner selects at least two channels to produce a tuner output signal;
at least one analog to digital converter (A/D) digitizes the tuner output signal; and
a digital processor receives the A/Ds samples and demodulates the channels.

12. A multi-channel iterative decoder for processing data from a plurality of digital channels comprising:
a plurality of input buffers, each buffer capable of storing data from at least one digital channel data;
a selector to select data from one input buffer;
an iterative decoder coupled to the selector for accepting data from an input buffer, the iterative decoder performing error correction decoding on the digital data;
a controller operatively coupled to the selector and iterative decoder to schedule decoder operations on the data accepted from an input buffer;
an input module for determining digital channel data signal quality and communicating the determination to the controller for use in selecting and scheduling iterative decoder operations; and
an output module to store and format decoded data;
whereby digital data from a plurality of channels is decoded using the shared resource of the iterative decoder.

13. The multi-channel iterative decoder of claim 12 wherein the controller schedules decoder operations by scheduling the best signal quality channel first.

14. The multi-channel iterative decoder of claim 12 wherein the controller schedules decoder operations by scheduling the worth signal quality channel first while excluding channels with a signal quality below a level that decoding does not recover data.

15. The multi-channel iterative decoder of claim 12 wherein the signal quality is related to signal to noise ratio.

* * * * *